(12) United States Patent
Jo et al.

(10) Patent No.: US 11,004,914 B2
(45) Date of Patent: May 11, 2021

(54) DISPLAY APPARATUS

(71) Applicant: Samsung Display Co., Ltd., Yongin-si (KR)

(72) Inventors: Minjun Jo, Yongin-si (KR); Youngmin Kim, Yongin-si (KR); Yongseung Park, Yongin-si (KR); Jawoon Lee, Yongin-si (KR); Haeri Choi, Yongin-si (KR); Youngseo Choi, Yongin-si (KR); Hyunmin Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/848,639

(22) Filed: Apr. 14, 2020

(65) Prior Publication Data

US 2021/0066410 A1 Mar. 4, 2021

(30) Foreign Application Priority Data

Sep. 2, 2019 (KR) .................. 10-2019-0108454

(51) Int. Cl.
*H01L 27/32* (2006.01)
*H01L 51/52* (2006.01)

(52) U.S. Cl.
CPC ........ *H01L 27/3234* (2013.01); *H01L 27/323* (2013.01); *H01L 27/3227* (2013.01); *H01L 27/3246* (2013.01); *H01L 27/3276* (2013.01); *H01L 51/525* (2013.01); *H01L 2251/303* (2013.01)

(58) Field of Classification Search
CPC combination set(s) only.
See application file for complete search history.

(56) References Cited

U.S. PATENT DOCUMENTS

| | | | |
|---|---|---|---|
| 10,466,822 B2 | 11/2019 | Kim et al. | |
| 2013/0258234 A1 | 10/2013 | Park et al. | |
| 2014/0138646 A1* | 5/2014 | Lee | H01L 23/544 257/40 |
| 2016/0064411 A1 | 3/2016 | Park et al. | |
| 2017/0176792 A1* | 6/2017 | Sonoda | G02F 1/133345 |
| 2017/0278912 A1* | 9/2017 | Kim | H01L 51/5237 |
| 2017/0287992 A1 | 10/2017 | Kwak et al. | |
| 2017/0294502 A1* | 10/2017 | Ka | H01L 27/3262 |
| 2018/0061921 A1* | 3/2018 | Son | H01L 27/3258 |
| 2018/0204040 A1 | 7/2018 | Kwon et al. | |
| 2018/0286925 A1* | 10/2018 | Kim | H01L 27/323 |

(Continued)

FOREIGN PATENT DOCUMENTS

KR 10-2013-0109709 A 10/2013
KR 10-2017-0103159 A 9/2017

(Continued)

*Primary Examiner* — Ratisha Mehta
(74) *Attorney, Agent, or Firm* — Lewis Roca Rothgerber Christie LLP

(57) ABSTRACT

A display apparatus includes: a first substrate including a transmission area, a display area that surrounds at least part of the transmission area, and a first non-display area between the transmission area and the display area; an insulating layer in the display area and the first non-display area; a plurality of display elements in the display area; a spacer above the insulating layer in the first non-display area and surrounding the transmission area; and a second substrate facing the first substrate.

20 Claims, 25 Drawing Sheets

(56) References Cited

U.S. PATENT DOCUMENTS

| | | | |
|---|---|---|---|
| 2018/0342700 A1* | 11/2018 | Cai | .................... H01L 51/5256 |
| 2019/0074479 A1 | 3/2019 | Lee et al. | |
| 2019/0245020 A1 | 8/2019 | Choi et al. | |
| 2019/0245029 A1 | 8/2019 | Ka et al. | |
| 2020/0144535 A1* | 5/2020 | Kim | .................... H01L 51/5256 |

FOREIGN PATENT DOCUMENTS

| | | |
|---|---|---|
| KR | 10-2017-0111827 A | 10/2017 |
| KR | 10-2017-0117291 A | 10/2017 |
| KR | 10-2018-0063633 A | 6/2018 |
| KR | 10-2018-0083700 A | 7/2018 |

* cited by examiner

DISPLAY APPARATUS

CROSS-REFERENCE TO RELATED APPLICATION

The present application claims priority to and the benefit of Korean Patent Application No. 10-2019-0108454, filed on Sep. 2, 2019, in the Korean Intellectual Property Office, the disclosure of which is incorporated herein in its entirety by reference.

BACKGROUND

1. Field

Aspects of one or more example embodiments relate to a display apparatus.

2. Description of Related Art

Recently, the variety of uses of display apparatuses has diversified. Also, the thickness and weight of display apparatuses has generally decreased, giving rise to a wider range of potential uses of display apparatuses.

By increasing the size of a display area of a display apparatus, various functions to be combined with or connected to a display apparatus may be added. As a way to add various functions by increasing the area, research into display apparatuses having an area for adding various functions (as opposed to for displaying an image) in the display area is ongoing.

The above information disclosed in this Background section is only for enhancement of understanding of the background and therefore the information discussed in this Background section does not necessarily constitute prior art.

SUMMARY

Aspects of one or more example embodiments relate to a display apparatus, and for example, to a display apparatus including a transmission area.

Aspects of one or more embodiments include a high-quality display apparatus having a transmission area through which light may be transmitted, as an area for adding various functions in a display area. However, these characteristics are just examples, and the scope of embodiments according to the present disclosure are not limited thereby.

Additional aspects will be set forth in part in the description which follows and, in part, will be more apparent from the description, or may be learned by practice of the presented example embodiments of the disclosure.

According to one or more example embodiments, a display apparatus includes a first substrate including a transmission area, a display area that surrounds at least a part of the transmission area, and a first non-display area between the transmission area and the display area, an insulating layer in the display area and the first non-display area, a plurality of display elements in the display area, a spacer above the insulating layer of the first non-display area and surrounding the transmission area, and a second substrate facing the first substrate.

According to some example embodiments, the insulating layer may include at least one inorganic insulating layer and at least one organic insulating layer.

According to some example embodiments, each of the plurality of display elements may include a first electrode, a second electrode facing the first electrode, and an emission layer between the first electrode and the second electrode, and the organic insulating layer may include a pixel-defining layer between the first electrodes of the display elements.

According to some example embodiments, the spacer may be arranged above the pixel-defining layer in the first non-display area.

According to some example embodiments, the second electrode may cover the pixel-defining layer and the spacer.

According to some example embodiments, the spacer may include a plurality of ring-shaped second spacers that surround the transmission area and are apart from one another.

According to some example embodiments, each of the plurality of second spacers may include a lower layer and an upper layer, and the lower layer may be a part of the insulating layer in the first non-display area.

According to some example embodiments, the display apparatus may further include a sealant bonding together the first substrate and the second substrate and arranged in a second non-display area that surrounds the display area.

According to some example embodiments, the display apparatus may further include a signal line bent along edges of the transmission area and arranged in the first non-display area.

According to some example embodiments, the spacer may overlap the signal line.

According to some example embodiments, the spacer may include an organic insulating material.

According to some example embodiments, the display apparatus may further include a transparent layer arranged in the transmission area.

According to some example embodiments, a display apparatus includes a first substrate, an insulating layer on the first substrate and having a through hole, a spacer above the insulating layer and surrounding the through hole along the edge of the through hole, and a second substrate facing the first substrate.

According to some example embodiments, the insulating layer may include at least one inorganic insulating layer and at least one organic insulating layer, and the spacer may be arranged above the at least one organic insulating layer.

According to some example embodiments, the spacer may include an organic insulating material.

According to some example embodiments, the spacer may include a plurality of second spacers that surround the through hole and are apart from one another.

According to some example embodiments, each of the plurality of second spacers may include a lower layer and an upper layer, and the lower layer may be a part of the insulating layer.

According to some example embodiments, the display apparatus may further include a transparent layer in the through hole of the insulating layer.

According to some example embodiments, the display apparatus may further include a plurality of display elements adjacent the through hole, and the spacer may be arranged between the display elements and the through hole and may have a ring shape and may surround the through hole.

According to some example embodiments, each of the plurality of display elements may include a first electrode, a second electrode facing the first electrode, and an emission layer between the first electrode and the second electrode, and the insulating layer may include a pixel-defining layer arranged between the first electrodes of the display elements, and the spacer may be arranged on the pixel-defining layer adjacent the through hole.

BRIEF DESCRIPTION OF THE DRAWINGS

The above and other aspects, features, and characteristics of certain embodiments according to the present disclosure will be more apparent from the following description taken in conjunction with the accompanying drawings, in which.

DETAILED DESCRIPTION

Figure 1A:
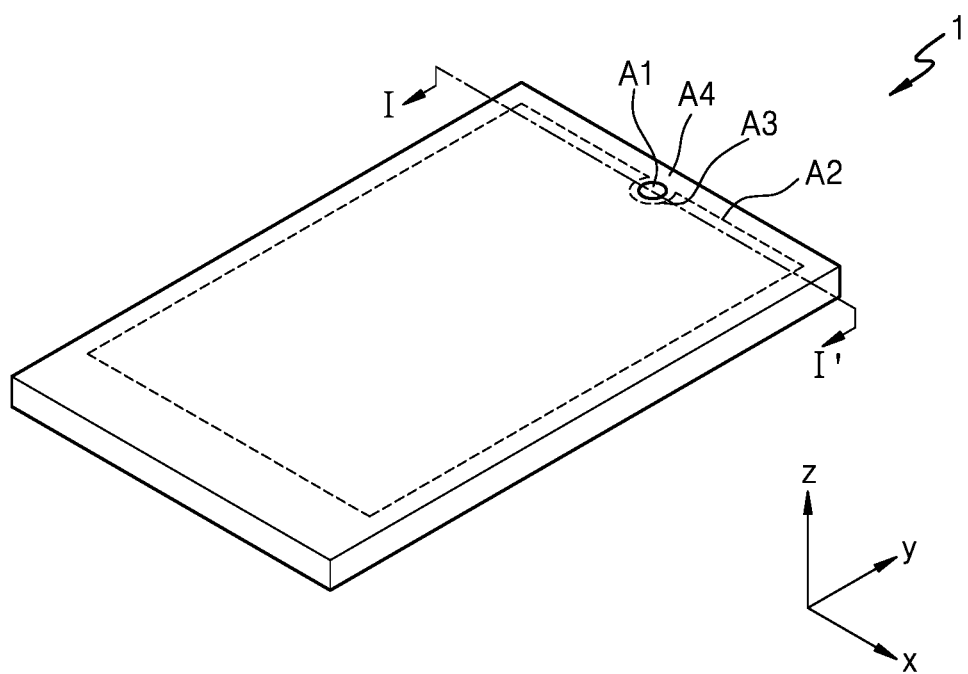
FIGS. 1A and 1B are perspective views schematically illustrating a display apparatus according to some example embodiments.

Reference will now be made in more detail to aspects of embodiments according to the present disclosure, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

It will be understood that although the terms "first," "second," etc. may be used herein to describe various elements, these elements should not be limited by these terms.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on," another layer, region, or element, it may be directly or indirectly formed on the other layer, region, or element. That is, for example, intervening layers, regions, or elements may be present.

Sizes of elements in the drawings may be exaggerated or reduced for convenience of explanation. In other words, since sizes and thicknesses of elements in the drawings are arbitrarily illustrated for convenience of explanation, the following embodiments are not limited thereto.

In the present specification, "A and/or B" represents A, B, or A and B. Also, in the present specification, "at least one of A and B" represents A, B, or A and B.

In the following embodiments, when a wire is referred to as "extending in a first direction or a second direction," this means not only that the wire extends in a rectilinear form but also in a zigzag or curved form in the first direction or the second direction.

In the following embodiments, when a layer, region, or element is referred to as being "on a plane," this means that the layer, region, or element is seen in an upward direction, and when a layer, region, or element is referred to as being "on a cross-section," this means that the layer, region, or element is seen in a lateral direction of a vertically-cut cross-section. In the following embodiments, "overlapping" includes "planar" and "cross-sectional" overlapping.

Figure 1B:
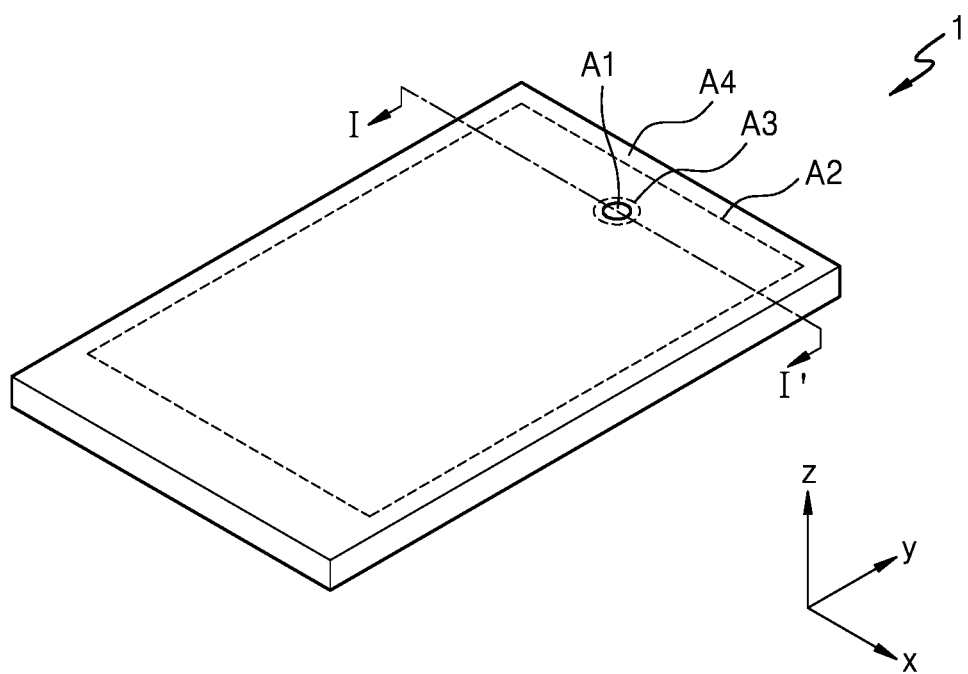

FIGS. 1A and 1B are perspective views schematically illustrating a display apparatus according to some example embodiments.

Referring to FIG. 1A, a display apparatus 1 may include a first area A1 and a second area A2 that surrounds at least a part of the first area A1. A plurality of pixels, for example, an array of pixels, may be arranged in the second area A2. An image may be displayed in the second area A2 using the array of pixels. The second area A2 corresponds to a display area in which an image (e.g., video images or static images) may be displayed. At least a part of the first area A1 may be surrounded by the second area A2. Thus, according to some example embodiments, at an edge of the second area A2, the first area A1 may extend at least partially past a line corresponding to the edge of the second area A2, such that a portion of the first area A1 lies on one side of the line and another portion of the first area A2 lies on the other side of the line.

According to some example embodiments, as shown in FIG. 1B, the first area A1 may be entirely surrounded by the second area A2. The first area A1 may be an area in which a component that is an electronic component for providing various functions to the display apparatus 1 is arranged. The first area A1 may include a transmission area through which light, sound, and/or other signals may be output or transmitted from the component to the outside or at which light, sound, or other signals may be transmitted to or received from an external source by the component. For example, when the component includes a sensor using light and a camera, etc., the first area A1 may be a transmission area through which light of the sensor or light proceeding towards the camera may transmit.

A third area A3 may be between the first area A1 and the second area A2. The third area A3 may include a kind of non-display area in which no pixels are arranged. A fourth area A4 that surrounds the second area A2 may include an area in which no pixels are arranged, like in the third area A3. A variety of wires and circuits may be arranged in the fourth area A4. As shown in FIG. 1A, the third area A3 may be connected to the fourth area A4, and as shown in FIG. 1B, the third area A3 may be an independent area that is not connected to the fourth area A4.

Each of pixels in the display apparatus 1 may include a light-emitting diode that is a display element for emitting light having a certain color. The light-emitting diode may include an organic light-emitting diode including an organic material as an emission layer. Alternatively, the light-emitting diode may include an inorganic light-emitting diode. Alternatively, the light-emitting diode may include a quantum dot as an emission layer. Hereinafter, for convenience of explanation, embodiments according to the present disclosure will be described in the context of a light-emitting diode that includes the organic light-emitting diode, but embodiments are not limited thereto.

In FIGS. 1A and 1B, the first area A1 is in the center of the second area A2 in a widthwise direction (for example, a ±x direction) of the display apparatus 1 (and/or the second area A2). However, embodiments according to the present disclosure are not limited thereto. According to some example embodiments, the first area A1 may be offset to the left or right in the widthwise direction of the display apparatus 1. Alternatively, the first area A1 may be at various positions, such as in an upward direction in a lengthwise direction (for example, a ±y direction) of the display apparatus 1, in the middle thereof, or in a downward direction thereof.

FIGS. 1A and 1B illustrate that the display apparatus 1 includes one first area A1. According to some example embodiments, the display apparatus 1 may include a plurality of first areas A1. That is, the display apparatus 1 may include a plurality of component areas (A1) overlapping or within the display area (A2). The shape, size, and position of the first area A1 may be modified in various ways.

Figure 2A:
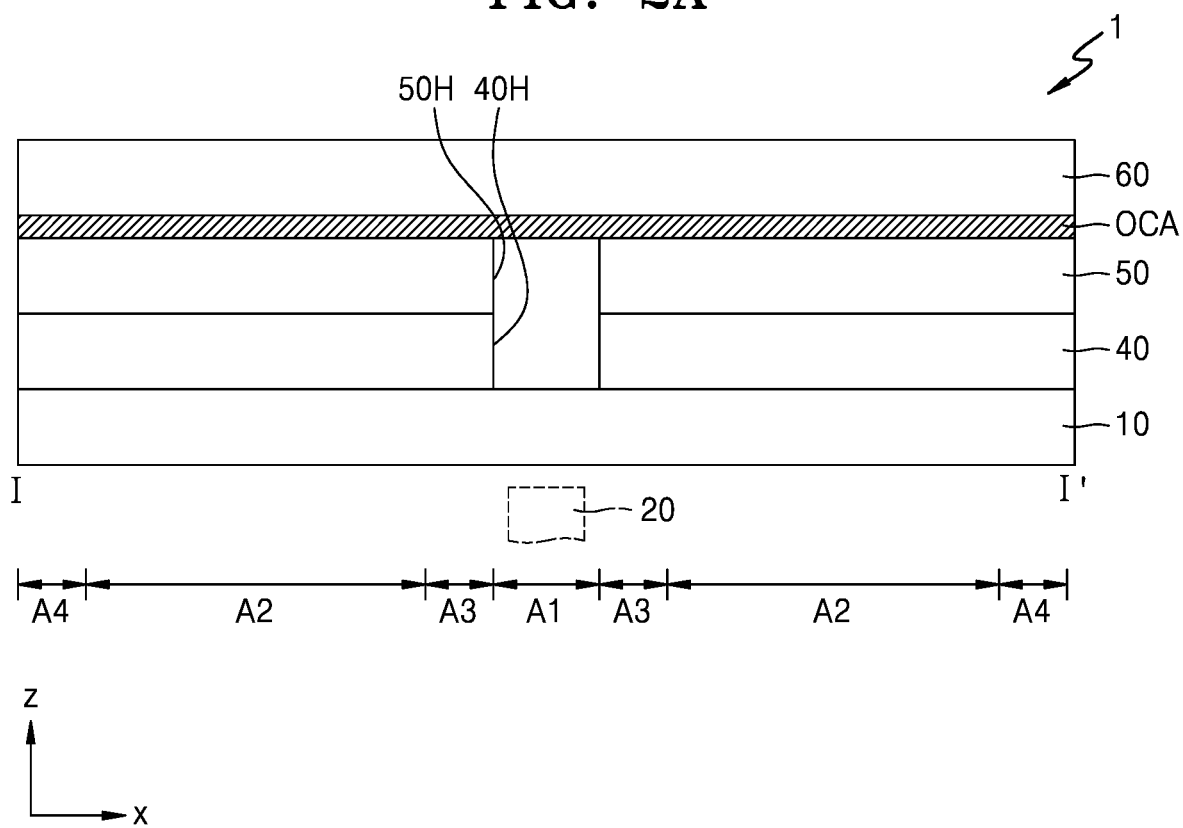
FIGS. 2A and 2B are cross-sectional views schematically illustrating a display apparatus according to some example embodiments.
Figure 2B:
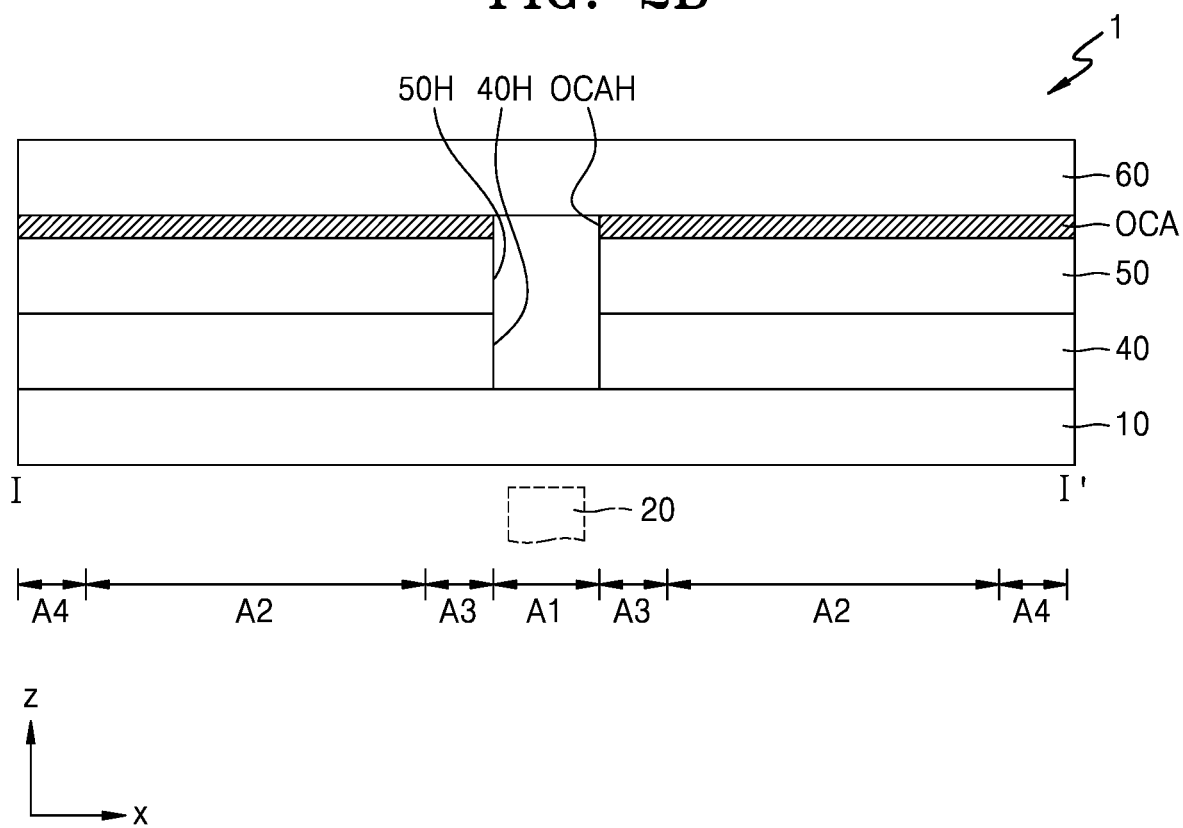

FIGS. 2A and 2B are cross-sectional views schematically illustrating a display apparatus according to some example embodiments, which correspond to a cross-section of the display apparatus taken along a line I-I' of FIGS. 1A and 1B.

Referring to FIG. 2A, the display apparatus 1 may include a display panel 10, an input sensing section 40 and an optical functional section 50 on the display panel 10. These elements may be covered by a window 60. The window 60 may be combined with a component under the window 60, for example, an optical functional section 50 using a cohesive layer, such as an optical clear adhesive (OCA). The display apparatus 1 may be provided in various electronic devices, such as a mobile phone, a tablet personal computer (PC), a laptop computer, and a smart watch.

The display panel 10 may include a plurality of diodes arranged in the second area A2. The input sensing section 40 may attain coordinate information based on external input, for example, a touch event. The input sensing section 40 may include a sensing electrode or touch electrode and trace lines connected to the sensing electrode or touch electrode. The input sensing section 40 may be positioned on the display panel 10. The input sensing section 40 may sense the external input using any suitable sensing mechanism, such as a mutual cap method or self cap method.

The input sensing section 40 may be formed directly on the display panel 10. Alternatively, the input sensing section 40 may be separately formed and then combined with the display panel 10 using the cohesive layer, such as the OCA. According to some example embodiments, as shown in FIG. 2A, the input sensing section 40 may be formed directly on the display panel 10. In this case, the cohesive layer may not be interposed between the input sensing section 40 and the display panel 10.

The optical functional section 50 may include an antireflective layer. The antireflective layer may reduce reflectivity of light (external light) incident toward the display panel 10 from the outside through the window 60. The antireflective layer may include a retarder and a polarizer. The retarder may be of a film type or liquid crystal coating type and include a λ/2 retarder or λ/4 retarder. The polarizer may also be of a film type or liquid crystal coating type. The film type may include an elongation type synthetic resin film, and the liquid crystal coating type may include liquid crystals arranged in a certain arrangement. The retarder and the polarizer may further include a protective film.

According to some example embodiments, the antireflective layer may include a structure of a black matrix and color filters. The color filters may be arranged in consideration of colors of light emitted from each of pixels of the display panel 10. According to some example embodiments, the antireflective layer may include a destructive interference structure. The destructive interference structure may include a first reflective layer and a second reflective layer on different layers. First reflected light and second reflected light, which are reflected from the first reflective layer and the second reflective layer, respectively, may destructively interfere. Thus, reflectivity of external light may be reduced.

The optical functional section 50 may include a lens layer. The lens layer may improve emission efficiency of light emitted from the display panel 10 or reduce a color deviation. The lens layer may include a layer having a concave or convex lens shape or/and a plurality of layers having different reflective indices. The optical functional section 50 may include all of the antireflective layer and the lens layer described above or one thereof.

Each of the input sensing section 40 and the optical functional section 50 may include a hole corresponding to the first area A1. For example, the input sensing section 40 may include a first hole 40H that passes through a top surface and a bottom surface of the input sensing section 40, and the optical functional section 50 may include a second hole 50H that passes through a top surface and a bottom surface of the optical functional section 50. The first hole 40H and the second hole 50H may be in the first area A1 and overlap each other. When a cohesive layer between the window 60 and the optical functional section 50 includes an OCA, as shown in FIG. 2A, the cohesive layer may not include the hole corresponding to the first area A1. According to some example embodiments, as shown in FIG. 2B, the OCA may include a hole OCAH corresponding to the first area A1.

As discussed above, a component 20 may be arranged in the first area A1. The component 20 may include an electronic component, for example, a sensor or signal emitter. For example, the component 20 may be an electronic component using light or sound. For example, the electronic component may include a sensor that receives light and uses light, such as an infrared sensor, a camera that receives light to capture an image, a sensor that outputs and detects light or sound so as to measure a distance or recognize a fingerprint, a small lamp that outputs light, or a speaker that outputs sound, etc. In the electronic component that uses light, light having various wavelength bands, such as visible rays, infrared rays, and ultraviolet rays, may be used. According to some example embodiments, the first area A1 may be a transmission area through which light output from the component 20 to the outside or proceeding toward the electronic component from the outside may transmit.

According to some example embodiments, when the display apparatus 1 is used as a smart watch or car instrument panel, the component 20 may be a member, such as a watch needle or a needle that indicates predetermined information (for example, car speed, etc.). When the display apparatus 1 includes a watch needle or car instrument panel, the component 20 may pass through the window 60 and may be exposed to the outside. The window 60 may include an opening corresponding to the first area A1.

The component 20 may include a component(s) that may add a certain function to the display apparatus 1, as described above, or a component such as an accessory for increasing an esthetic sense of the display panel 10.

Figure 3A:
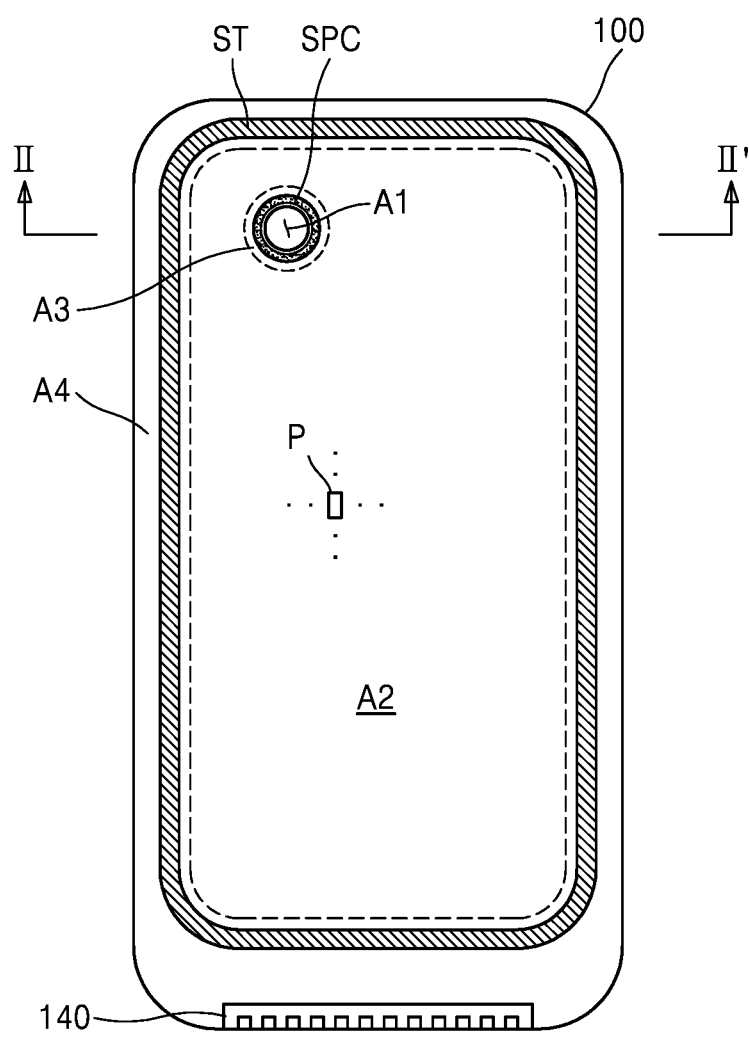
FIG. 3A is a plan view schematically illustrating a display panel according to some example embodiments.
Figure 3B:
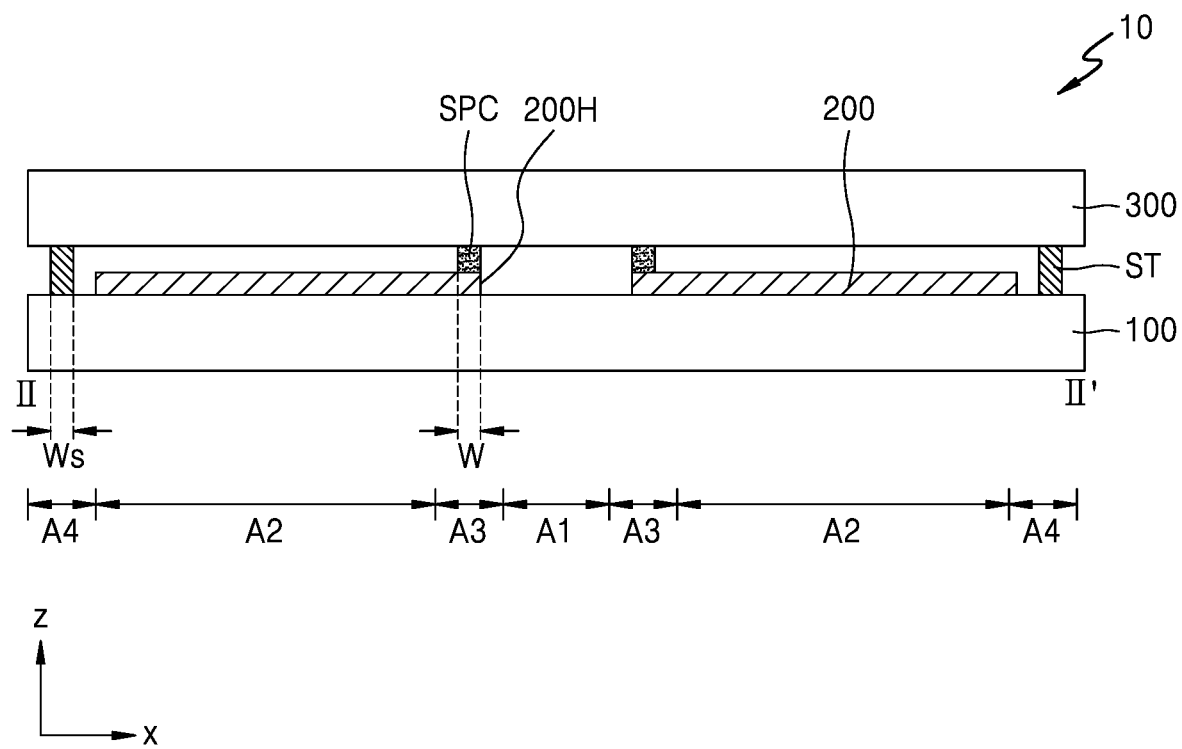
FIG. 3B is a cross-sectional view of the display panel taken along the line II-II' of FIG. 3A.

FIG. 3A is a plane view schematically illustrating a display panel according to some example embodiments, and FIG. 3B is a cross-sectional view of the display panel taken along a line II-II' of FIG. 3A.

Referring to FIGS. 3A and 3B, the display panel 10 includes a display layer 200 on a substrate 100. The substrate 100 may include a glass material or polymer resin. For example, the substrate 100 may include a glass material having a main component of silicon dioxide ($SiO_2$) or resin, such as reinforced plastic.

The display layer 200 may be positioned to correspond to the second area A2 and include a plurality of pixels. Each of the plurality of pixels included in the display layer 200 may include a pixel circuit and a display element electrically connected to the pixel circuit. The pixel circuit may include a transistor and a storage capacitor. The display element may include a light-emitting diode, for example, an organic light-emitting diode OLED.

The display layer 200 may be covered by an encapsulation substrate 300. The encapsulation substrate 300 may include a glass material or polymer resin. For example, the encapsulation substrate 300 may include a glass material having a main component of $SiO_2$ or resin, such as reinforced plastic. The encapsulation substrate 300 is arranged to face the substrate 100, and a sealant ST may be positioned or deposited between the substrate 100 and the encapsulation substrate 300. The sealant ST may be in a fourth area A4, for example, continuously arranged along an edge of the substrate 100 between the substrate 100 and the encapsulation substrate 300 and surround the display layer 200 entirely. When viewed from a direction perpendicular or normal to a top surface of the substrate 100 (or on a planar view), the second area A2 may be entirely surrounded by the sealant ST. The sealant ST may combine the substrate 100 with the encapsulation substrate 300 so as to prevent oxygen or moisture from penetrating into the display layer 200 and to improve apparatus strength.

The sealant ST may be an inorganic material, for example, frit. The sealant ST may be dispensed by a dispenser or screen printing method. The frit may include a glass raw material having a powder-type material but may include a paste-type material in which a laser or IR absorbing material, an organic binder and a filler for reducing a thermal expansion coefficient is added to a main material of $SiO_2$. The paste-type frit may be cured due to removal of the organic binder and moisture via a drying or firing process. The laser or IR absorbing material may include a transition metal compound. Laser light may be used as a heat source for curing the sealant ST to combine the substrate 100 with the encapsulation substrate 300.

A part of the display layer 200, for example, a part corresponding to the first area A1 may be removed. In this regard, FIG. 3B illustrates that the display layer 200 includes a fourth hole 200H. The display layer 200 may include pixel circuits and display elements described above and may further include insulating layers between wires connected to each of the pixel circuits, between electrodes, and/or electrodes of the display element. For example, the fourth hole 200H may be formed by overlapping holes of each of the insulating layers in the display layer 200 described above. The fourth hole 200H of the display layer 200 may be formed to pass through the top surface and the bottom surface of the display layer 200. The display element 200 in the third area A3 may not include pixel circuits and display elements.

A spacer SPC may be arranged in the third area A3. The spacer SPC may be arranged at an upper portion of at least one insulating layer that extends from the second area A2 to the third area A3 and may include an organic material. The spacer SPC may surround the third area A1. According to some example embodiments, in order to reduce the area of the third area A3, a width W of the spacer SPC may be less than a width Ws of the sealant ST. The spacer SPC may maintain a gap between the substrate 100 and the encapsulation substrate 300 so as to support the encapsulation substrate 300 and may function as a dam for preventing a material introduced through the first area A1 from penetrating into the display layer 200 by distinguishing the first area A1 from the second area A2.

A pad unit 140 having a plurality of pads therein may be arranged at one side of the fourth area A4. The pad unit 140 may not be covered by an insulating layer but may be exposed and thus electrically connected to a printed circuit board (PCB). The pad unit 140 may be arranged outside the sealant ST. The sealant ST may be arranged at an upper portion of a plurality of connection wires for connecting wires connected to pixels of the second area A2 to the pad unit 140 and thus may overlap a part of the plurality of connection wires.

Figure 4:
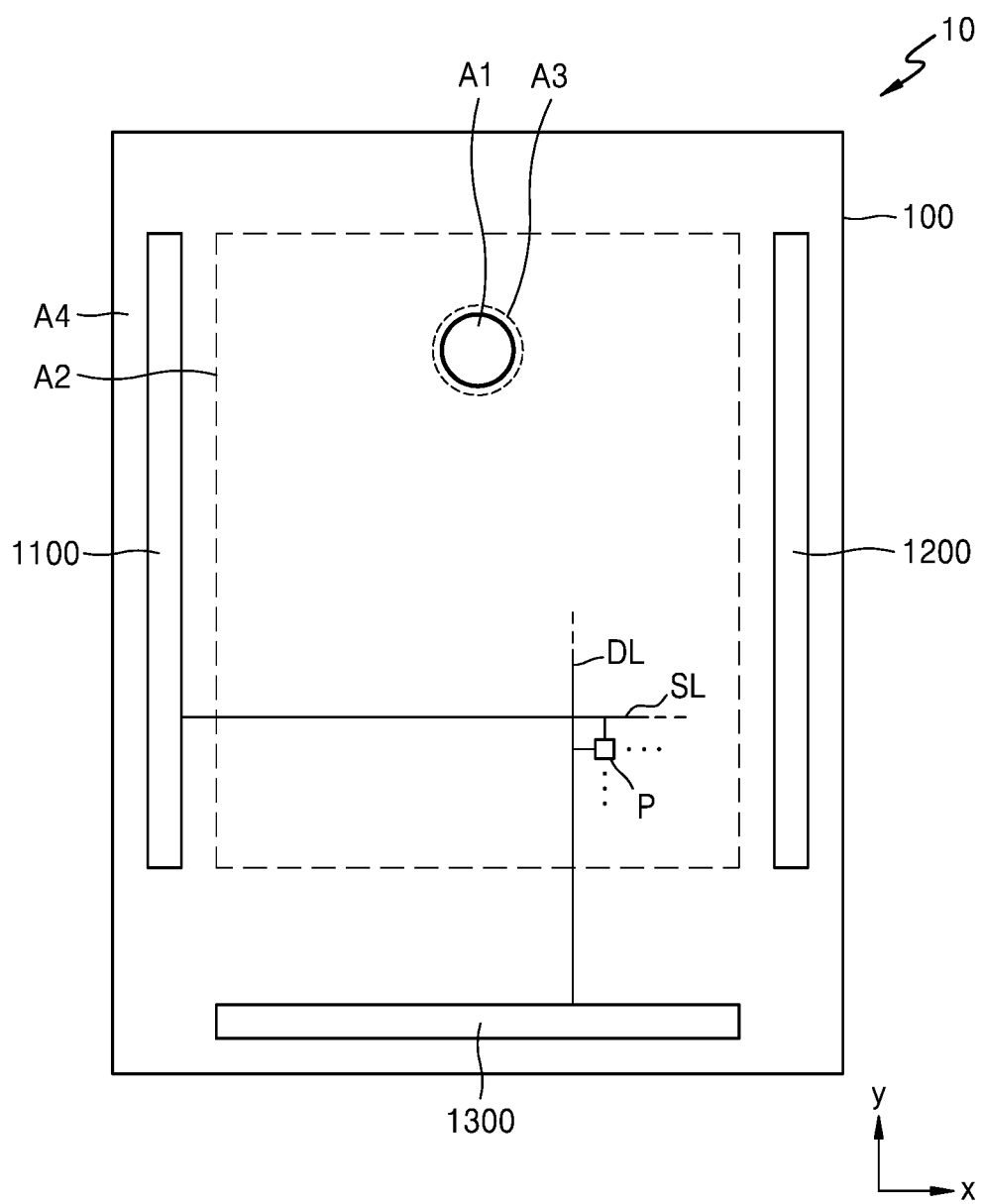
FIG. 4 is a plan view schematically illustrating a display panel according to some example embodiments.
Figure 5:
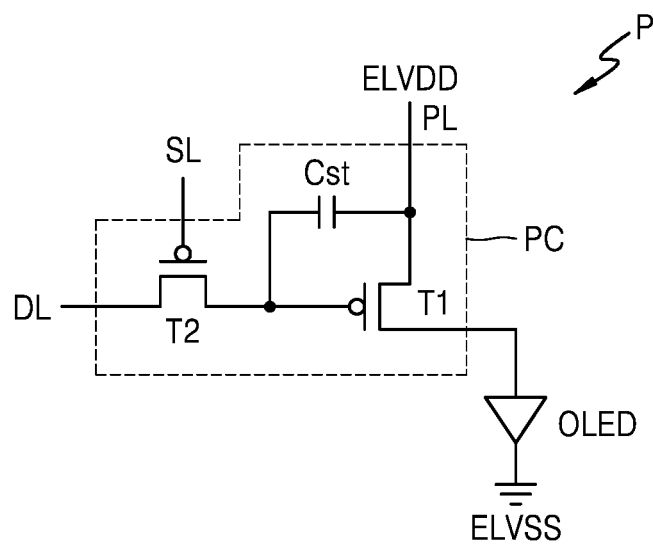
FIG. 5 is an equivalent circuit diagram schematically illustrating one pixel of the display panel of FIG. 4.

FIG. 4 is a plane view schematically illustrating a display panel according to some example embodiments, and FIG. 5 is an equivalent circuit diagram schematically illustrating one pixel of the display panel of FIG. 4.

The appearance of the display panel 10 may be substantially the same as that of the display panel 10 described above with reference to FIGS. 3A and 3B. For example, the display panel 10 may include a first area A1, a second area A2 that surrounds the first area A1, a third area A3 between the first area A1 and the second area A2, and a fourth area A4 that surrounds the second area A2.

The display panel 10 may include a plurality of pixels P arranged in the second area A2. Each pixel P may include a pixel circuit PC and a display element connected to the pixel circuit PC, for example, an organic light-emitting diode OLED, as shown in FIG. 5. The pixel circuit PC may include a first transistor T1, a second transistor T2, and a capacitor Cst. Each pixel P may emit red, green, or blue light or red, green, blue, or white light, for example, through the organic light-emitting diode OLED. The first transistor T1 and the second transistor T2 may be implemented with thin-film transistors.

The second transistor T2 that is a switching transistor may be connected to a scan line SL and a data line DL and may transmit a data signal input from the data line DL according to a switching voltage input from the scan line SL to the first transistor Ti. The capacitor Cst may be connected to the second transistor T2 and a driving voltage line PL and may store a voltage corresponding to a difference between a voltage transmitted from the second transistor T2 and a first power supply voltage ELVDD supplied to the driving voltage line PL.

The first transistor T1 that is a driving transistor may be connected to the driving voltage line PL and the capacitor Cst and may control a driving current that flows through the organic light-emitting diode OLED from the driving voltage line PL in correspondence with a voltage value stored in the capacitor Cst. The organic light-emitting diode OLED may emit light having certain brightness due to the driving current. A second power supply voltage ELVSS may be supplied to an opposite electrode (for example, a cathode) of the organic light-emitting diode OLED.

FIG. 5 illustrates that the pixel circuit PC includes two transistors and one storage capacitor. However, embodiments according to the present disclosure are not limited thereto. The number of transistors and the number of storage capacitors may be changed in various ways according to a design of the pixel circuit PC.

Referring back to FIG. 4, the third area A3 may surround the first area A1. The third area A3 may be an area in which no display element, such as an organic light-emitting diode for emitting light, is arranged. Signal lines for providing signals to the plurality of pixels P in the vicinity of the first area A1 may pass around or through the third area A3. A first scan driver 1100 and a second scan driver 1200 for providing scan signals to each pixel P, a data driver 1300 for providing a data signal to each pixel P, and a main power supply wire for providing first and second power supply voltages may be arranged in the fourth area A4. Each of the first scan driver 1100 and the second scan driver 1200 may be positioned in the fourth area A4 and at both sides of the second area A2 with the second area A2 between the first scan driver 1100 and the second scan driver 1200. The first scan driver 1100, the second scan driver 1200, and the data driver 1300 may be positioned outside the sealant ST in the fourth area A4.

FIG. 4 illustrates that the data driver 1300 is adjacent to one side of the substrate 100. However, according to some example embodiments, the data driver 1300 may be positioned on a flexible printed circuit board (FPCB) electrically connected to a pad at one side of the display panel 10.

Figure 6A:
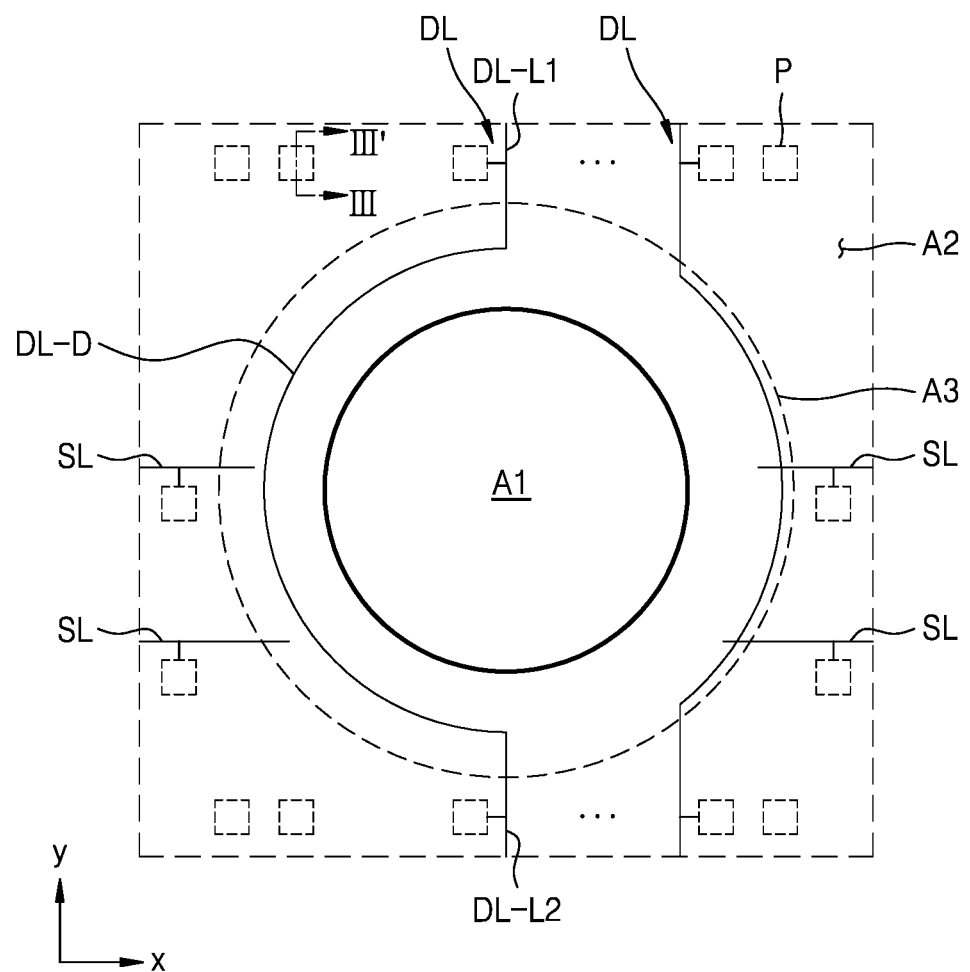
FIGS. 6A and 6B are plan views illustrating part of the display panel according to some example embodiments.
Figure 6B:
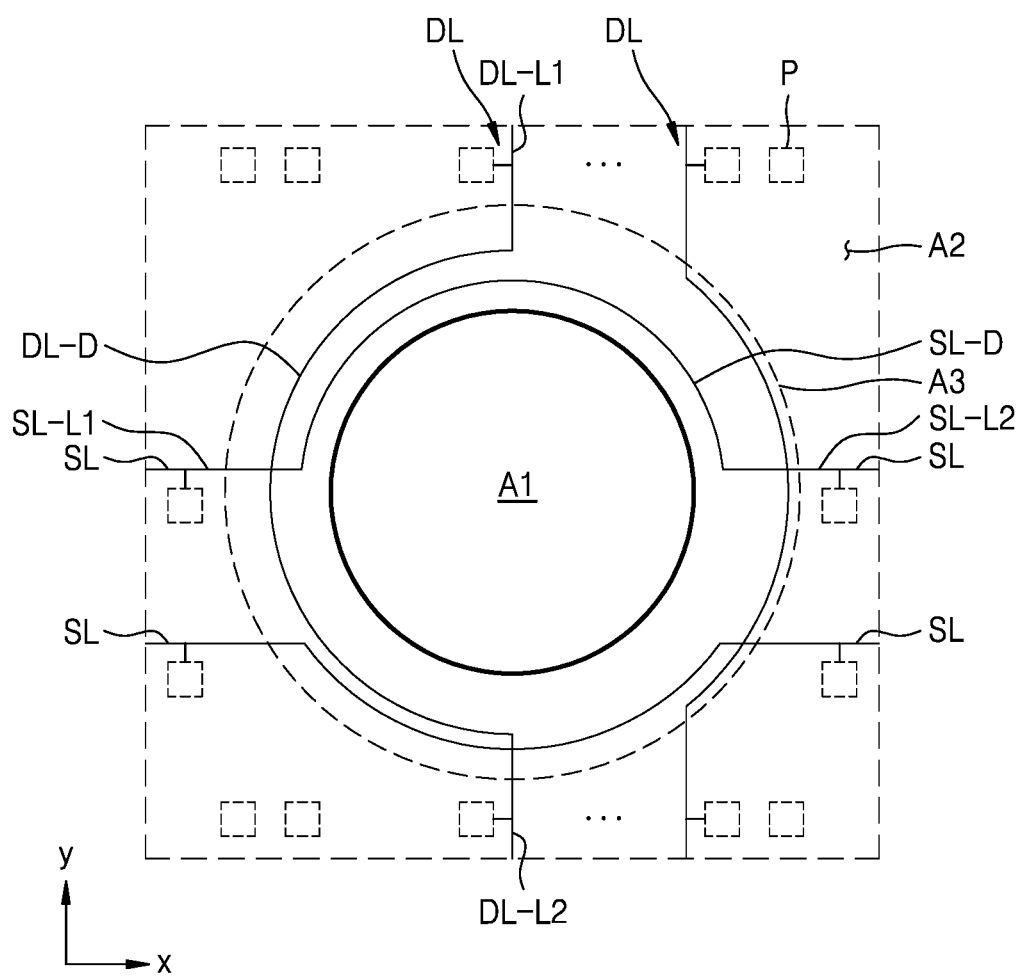

FIGS. 6A and 6B are plane views illustrating part of a display panel according to some example embodiments.

Referring to FIG. 6A, some of the pixels P in the second area A2 may be apart from one another based on the first area A1. For example, the first area A1 may be between two pixels P in a ±x direction of FIG. 6A. Similarly, the first area A1 may be between two pixels P in a ±y direction of FIG. 6A.

The two pixels P in the ±y direction with the first area A1 therebetween may be electrically connected to the same data line DL, and the data line DL may be bent in the third area A3. For example, a part of the data line DL may be bent from the third area A3 along edges of the first area A1, for example, in a direction of a circular arc of the first area A1 and may extend. The data line DL may extend in the ±y direction and may include a first portion DL-L1 and a second portion DL-L2 that pass the second area A2, and a third portion DL-D that connects the first portion DL-L1 to the second portion DL-D2 and extends along the circular arc direction of the first area A1 in the third area A3.

The two pixels P in the ±x direction with the first area A1 therebetween may be electrically connected to different scan lines SL. The scan lines SL at the left side of the first area A1 may be electrically connected to the first scan driver 1100 described above with reference to FIG. 4, and the scan lines SL at the right side of the first area A1 may be electrically connected to the second scan driver 1200 described above with reference to FIG. 4. As shown in FIG. 4, when the display panel 10 includes two scan drivers, the pixels P at both sides of the first area A1 may be electrically connected to the scan lines SL that are apart from each other.

According to some example embodiments, as shown in FIG. 6B, when the second scan driver 1200 is omitted, the two pixels P in the ±x direction with the first area A1 therebetween may be connected to the same scan line, and the scan lines SL described above may also include a portion that extends along the circular arc direction of the first area A1 in the third area A3. For example, the scan lines SL may include a first portion SL-L1 and a second portion SL-L2 that extend in the ±x direction and pass the second area A2 and a third portion SL-D that connects the first portion SL-L1 to the second portion SL-L2 and extends along the circular arc direction of the first area A1 in the third area A3.

Figure 7:
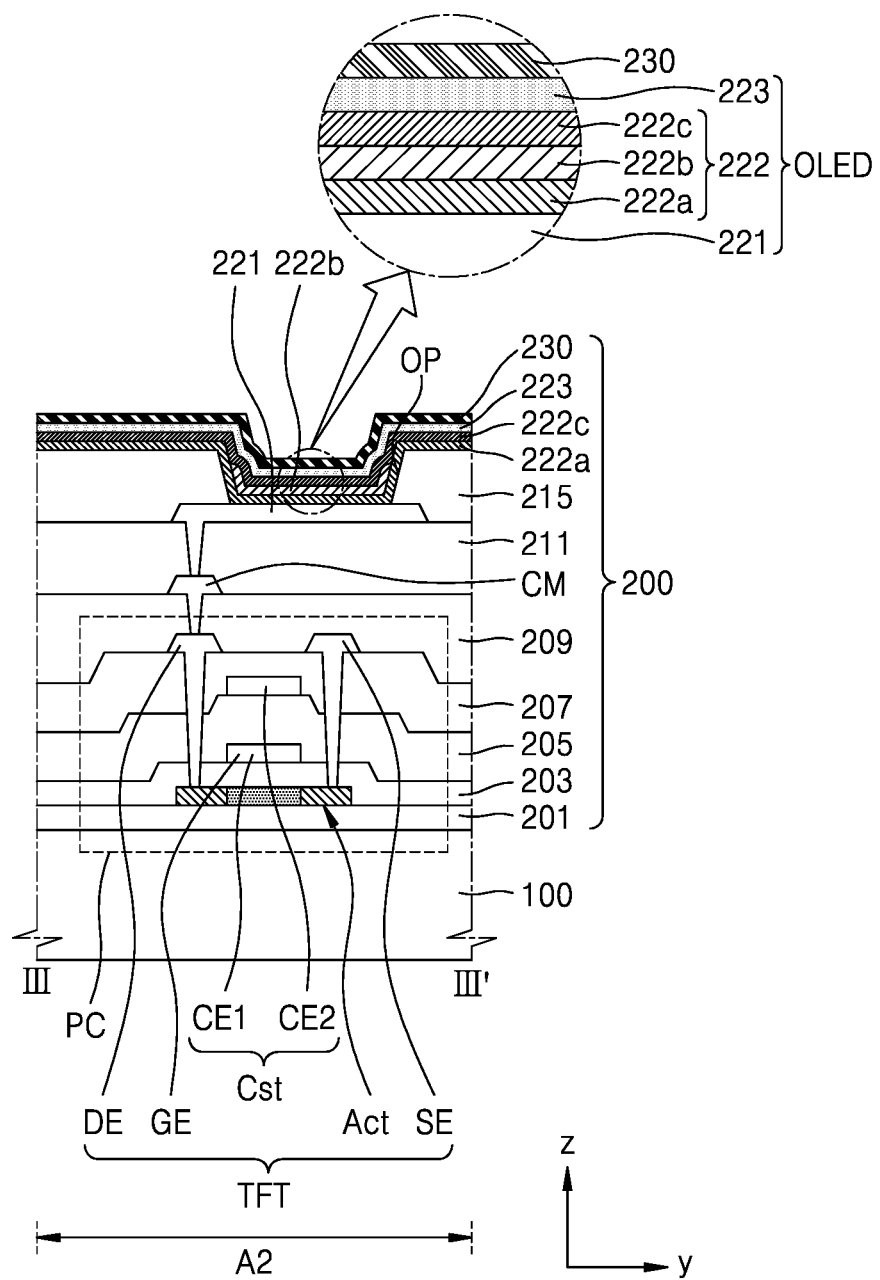
FIG. 7 is a cross-sectional view of one pixel of a display panel according to some example embodiments.

FIG. 7 is a cross-sectional view of one pixel of a display panel according to some example embodiments, which may correspond to a cross-section of the display panel taken along a line III-III' of FIG. 6A.

Referring to FIG. 7, a pixel circuit PC may be arranged on the substrate 100, and an organic light-emitting diode OLED may be arranged on the pixel circuit PC and electrically connected to the pixel circuit PC. The substrate 100 may include glass or polymer resin, as described above with reference to FIGS. 3A and 3B. The substrate 100 may have a single layer or multi-layer structure.

A buffer layer 201 may be formed on the substrate 100 so as to prevent or reduce instances of impurities penetrating into a semiconductor layer Act of a thin-film transistor TFT. The buffer layer 201 may include inorganic insulating materials, such as silicon nitride, silicon oxynitride, and silicon oxide, and may have a single layer or multi-layer structure including the inorganic insulating materials described above.

The pixel circuit PC may be arranged on the buffer layer 201. The pixel circuit PC may include the thin-film transistor TFT and a capacitor Cst. The thin-film transistor TFT may include the semiconductor layer Act, a gate electrode GE, a source electrode SE, and a drain electrode DE. The thin-film transistor TFT shown in FIG. 7 may include one of the transistors described above with reference to FIG. 5, for example a driving transistor. According to some example embodiments, the gate electrode GE is of a top gate type arranged on the semiconductor layer Act with a gate insulating layer 203 between the gate electrode GE and the semiconductor layer Act. However, according to some example embodiments, the thin-film transistor TFT may be of a bottom gate type.

The semiconductor layer Act may include polysilicon. Alternatively, the semiconductor layer Act may include amorphous silicon, an oxide semiconductor, or an organic semiconductor. The gate electrode GE may include low resistance metal materials. The gate electrode GE may include conductive materials including molybdenum (Mo), aluminum (Al), copper (Cu), and titanium (Ti), etc. The gate electrode GE may have a single layer or multi-layer structure including the materials described above.

The gate insulating layer 203 between the semiconductor layer Act and the gate electrode GE may include inorganic insulating materials, such as silicon oxide, silicon nitride, silicon oxynitride, aluminum oxide, titanium oxide, tantalum oxide, and hafnium oxide, etc. The gate insulating layer 203 may have a single layer or multi-layer structure including the materials described above.

The source electrode SE and the drain electrode DE may include materials having excellent conductivity. The source electrode SE and the drain electrode DE may include conductive materials including Mo, Al, Cu, and Ti, etc. and may have a multi-layer or single layer structure including the materials described above. According to some example embodiments, the source electrode SE and the drain electrode DE may have a multi-layer structure of Ti/Al/Ti.

The capacitor Cst may include a lower electrode CE1 and an upper electrode CE2 that overlap the lower electrode CE1 with a first interlayer insulating layer 205 between the lower electrode CE1 and the upper electrode CE2. The capacitor Cst may overlap the thin-film transistor TFT. In this regard, FIG. 7 illustrates that the gate electrode GE of the thin-film transistor TFT is the lower electrode CE1 of the capacitor Cst. According to some example embodiments, the capacitor Cst may not overlap the thin-film transistor TFT. The storage capacitor Cst may be covered by a second interlayer insulating layer 207.

Each of the first interlayer insulating layer 205 and the second interlayer insulating layer 207 may include inorganic insulating materials, such as silicon oxide, silicon nitride, silicon oxynitride, aluminum oxide, titanium oxide, tantalum oxide, and hafnium oxide, etc. Each of the first interlayer insulating layer 205 and the second interlayer insulating layer 207 may have a single layer or multi-layer structure including the materials described above.

The pixel circuit PC including the thin-film transistor TFT and the capacitor Cst may be covered by a first organic insulating layer 209. The first organic insulating layer 209 that is a planarization insulating layer may have a surface of which top is roughly flat. The first organic insulating layer 209 may include organic insulating materials, such as general-purpose polymer, for example, polymethylmethacrylate (PMMA) or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof, etc. According to some example embodiments, the first organic insulating layer 209 may include polyimide.

A connection electrode CM may be formed on the first organic insulating layer 209. The connection electrode CM may include conductive materials including Mo, Al, Cu, and Ti, etc. and may have a multi-layer or single layer structure including the materials described above. The connection electrode CM may include the same materials as those of the source electrode SE or the drain electrode DE of the thin-film transistor TFT. For example, the connection electrode CM may have a multi-layer structure of Ti/Al/Ti.

A second organic insulating layer 211 may be formed on the connection electrode CM. The second organic insulating layer 211 may include a surface of which top is roughly flat. The second organic insulating layer 211 may include organic insulating materials, such as general-purpose polymer, for example, PMMA or PS, a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof. According to some example embodiments, the second organic insulating layer 211 may include polyimide. According to some example embodiments, an inorganic insulating layer may be further arranged between the first organic insulating layer 209 and the second organic insulating layer 211.

The pixel electrode 221 may be formed on the second organic insulating layer 211. The pixel electrode 221 may include conductive oxide, such as indium tin oxide (ITO), indium zinc oxide (IZO), zinc oxide (ZnO), indium oxide (In2O3), indium gallium oxide (IGO), or aluminum zinc oxide (AZO), etc. According to some example embodiments, the pixel electrode 221 may include a reflective film including silver (Ag), magnesium (Mg), Al, platinum (Pt), palladium (Pd), gold (Au), nickel (Ni), neodymium (Nd), iridium (Ir), chromium (Cr), or a compound thereof. According to some example embodiments, the pixel electrode 221 may further include a film including ITO, IZO, ZnO, or $In_2O_3$ on/under the reflective film described above.

A pixel-defining layer 215 may be formed on the pixel electrode 221. The pixel-defining layer 215 may include an opening OP for exposing a top surface of the pixel electrode 221 and may cover edges of the pixel electrode 221. The pixel-defining layer 215 may be arranged between a plurality of pixel electrodes 221 and surround the plurality of pixel electrodes 221. The pixel-defining layer 215 may include an organic insulating material. Alternatively, the pixel-defining layer 215 may include an inorganic insulating material, such as silicon nitride, silicon oxynitride, or silicon oxide. Alternatively, the pixel-defining layer 215 may include an organic insulating material and an inorganic insulating material.

An intermediate layer 222 may include an emission layer 222b. The emission layer 222b may include an organic material, for example. The emission layer 222b may include a polymer or small molecular weight organic material that emits light having a certain color. The intermediate layer 222 may include a first functional layer 222a under the emission layer 222b and/or a second functional layer 222c on the emission layer 222b.

The first functional layer 222a may have a single layer or multi-layer structure. For example, when the first functional layer 222a includes a polymer material, the first functional layer 222a that is a hole transport layer (HTL) having a single layer structure may include poly-(3,4)-ethylenedioxythiophene (PEDOT) or polyaniline (PANI). When the first functional layer 222a includes a small molecular weight material, the first functional layer 222a may include a hole injection layer (HIL) and a HTL.

The second functional layer 222c may be selectively formed. For example, when the first functional layer 222a and the emission layer 222b include polymer materials, the second functional layer 222c may be formed. The second functional layer 222c may have a single layer or multi-layer structure. The second functional layer 222c may include an electron transport layer (ETL) and/or an electron injection layer (EIL).

The emission layer 222b of the intermediate layer 222 may be arranged in each pixel in the second area A2. The emission layer 222b may overlap the opening OP of the pixel-defining layer 215 or/and the pixel electrode 221. Each of the first and second functional layers 222a and 222c of the intermediate layer 222 that is a single body may be formed in the second area A2 and the third area A3.

An opposite electrode 223 may include a conductive material having a small work function. For example, the opposite electrode 223 may include a (semi-) transparent layer including Ag, Mg, Al, Pt, palladium (Pd), Au, Ni, Nd, Ir, Cr, lithium (Li), calcium (Ca), or an alloy thereof, etc. Alternatively, the opposite electrode 223 may further include a layer, such as ITO, IZO, ZnO, or $In_2O_3$, etc. on the (semi-) transparent layer including the materials described above. The opposite electrode 223 that is a single body may be formed to cover a plurality of pixel electrodes 221 in the second area A2. The intermediate layer 222 and the opposite electrode 223 may be formed through thermal deposition.

A capping layer 230 may be arranged on the opposite electrode 223. The capping layer 230 may include lithium fluoride (LiF), an inorganic material, or/and an organic material. According to some example embodiments, the capping layer 230 may be omitted.

Figure 8:
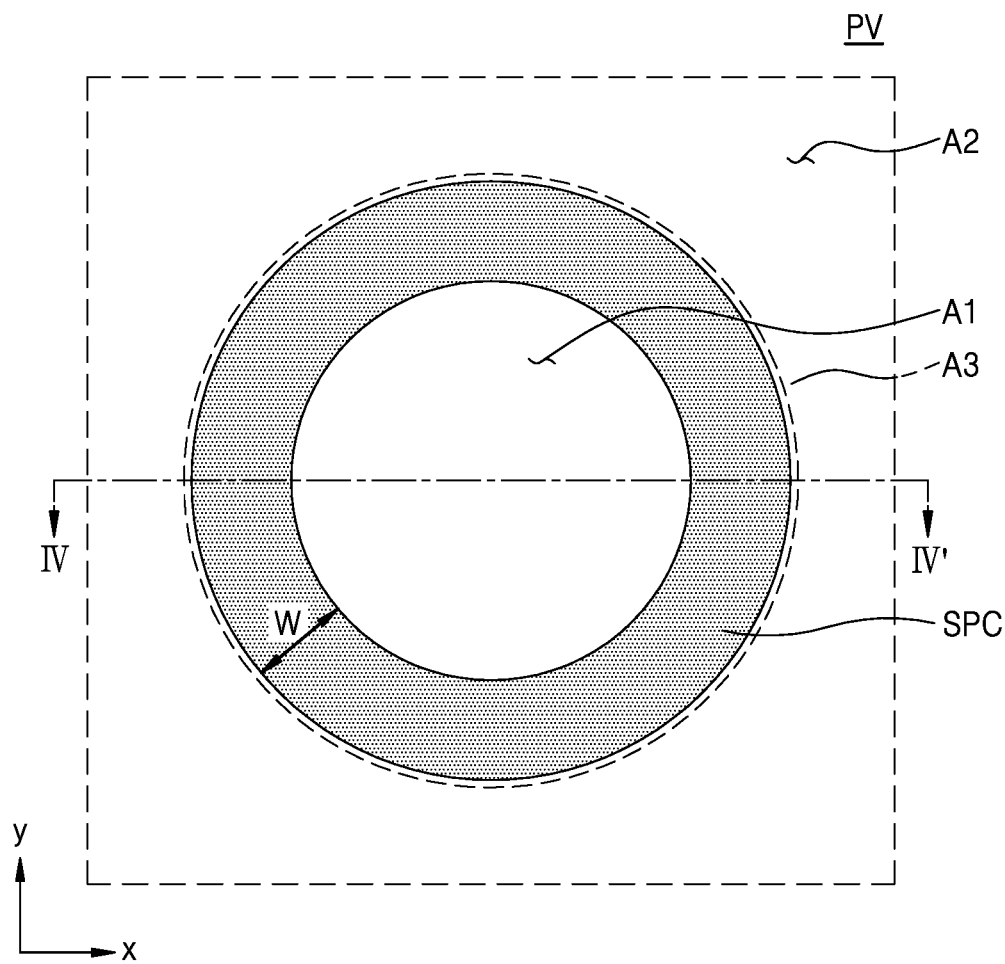
FIG. 8 is a view schematically illustrating part of a display panel according to some example embodiments.
Figure 8:
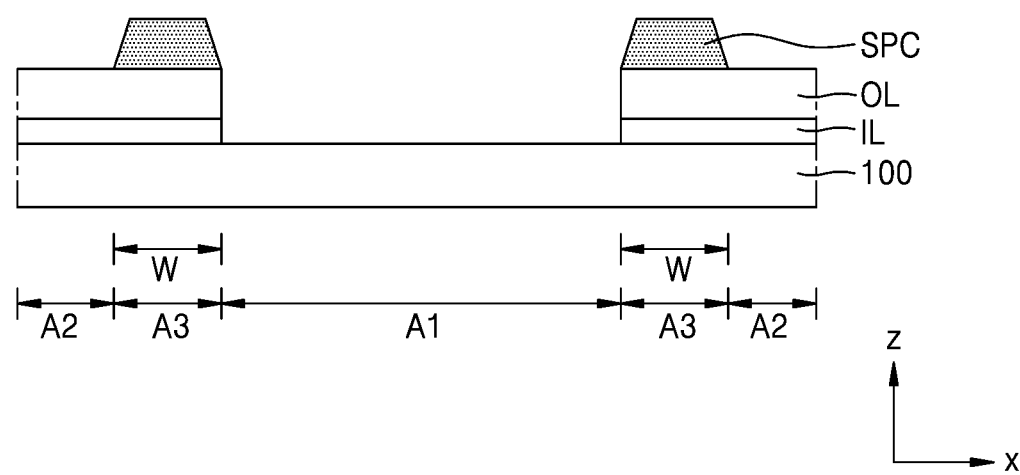

FIG. 8 is a view schematically illustrating part of a display panel according to some example embodiments. FIGS. 9 through 12 may correspond to a cross-section of the display panel taken along a line IV-IV' of a plane view PV of FIG. 8.

FIG. 8 illustrates part of the display panel including the first area A1 and the third area A3 that surrounds the first area A1. The plane view PV of FIG. 8 means a view defined in an xy plane, and a cross-sectional view CSV of FIG. 8 means a view defined in an xz plane. The cross-sectional view CSV of FIG. 8 may correspond to a cross-section of the display panel taken along the IV-IV' of the plane view PV.

Referring to FIG. 8, a spacer SPC may be arranged in the third area A3 of the display panel 10. The spacer SPC may be arranged on at least one inorganic insulating layer IL and at least one organic insulating layer OL, which are arranged above the substrate 100. The at least one inorganic insulating layer IL and the at least one organic insulating layer OL may be insulating layers that extend from the second area A2 to the third area A3. For example, the inorganic insulating layer IL may include at least one of the buffer layer 201, the gate insulating layer 203, the first interlayer insulating layer 205, and the second interlayer insulating layer 207, which are shown in FIG. 7. The organic insulating layer OL may include at least one of the first organic insulating layer 209, the second organic insulating layer 211, and the pixel-defining layer 215, which are shown in FIG. 7.

The spacer SPC may have a shape of a donut or ring that surrounds the first area A1 fully. A width W of the spacer SPC may be equal to or less than a width of the third area A3. The spacer SPC may include an organic insulating material, such as polyimide. Alternatively, the spacer SPC may include an inorganic insulating material, such as silicon nitride or silicon oxide, or an organic insulating material and an inorganic insulating material. The spacer SPC may include a different material from a material for forming the pixel-defining layer 215. Alternatively, the spacer SPC may include the same material as that of the pixel-defining layer 215. In this case, the pixel-defining layer 215 and the spacer SPC may be formed together in a mask process using a halftone mask. According to some example embodiments, the pixel-defining layer 215 and the spacer SPC may include polyimide.

Figure 9:
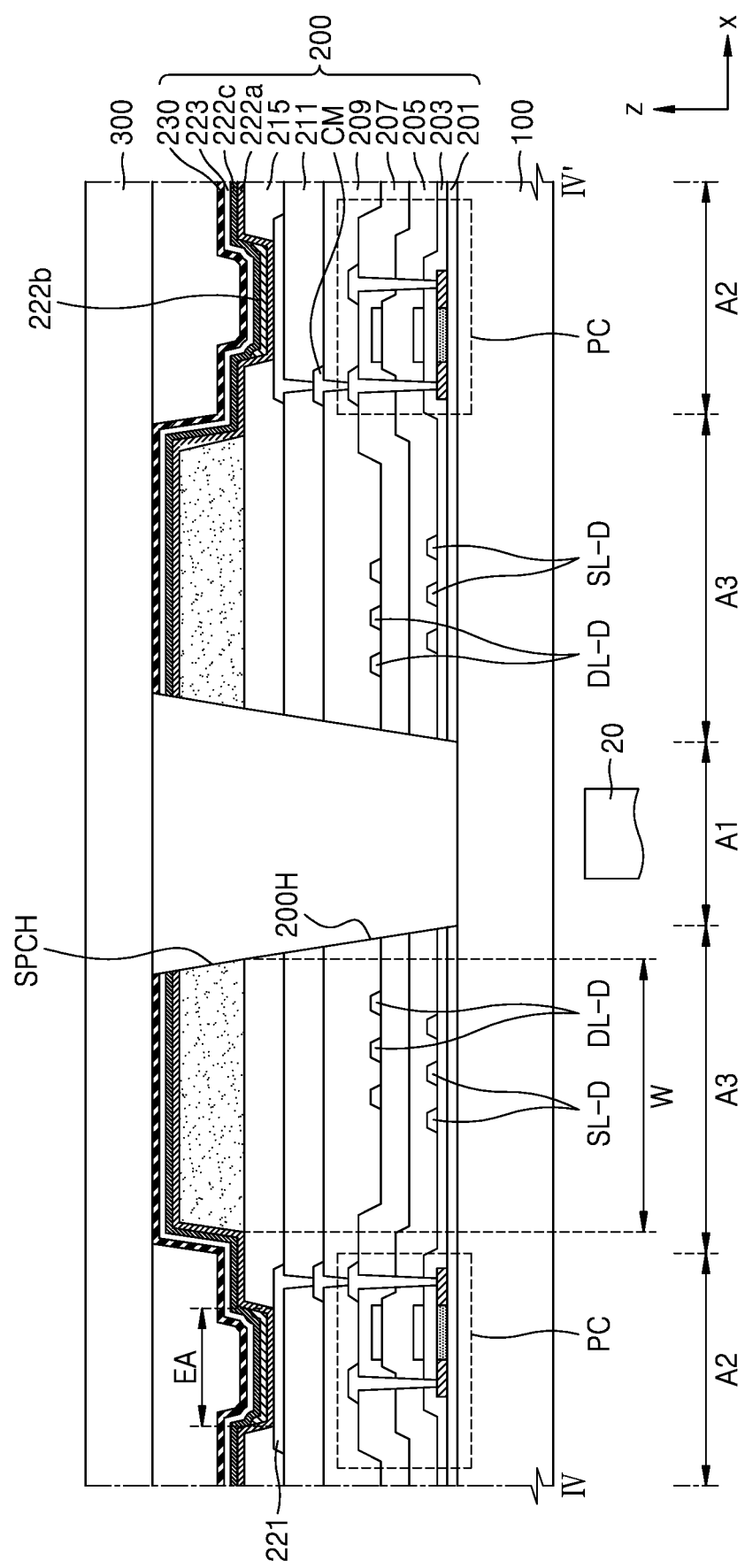
FIGS. 9 through 13 are cross-sectional views of the display panel taken along the line IV-IV' of FIG. 8.

Referring to FIG. 9, the buffer layer 201, the gate insulating layer 203, the first interlayer insulating layer 205, the second interlayer insulating layer 207, the first organic insulating layer 209, and the second organic insulating layer 211 are arranged on the substrate 100. The pixel circuit PC may include a thin-film transistor and a capacitor. A semiconductor layer and electrodes of the thin-film transistor and electrodes of a capacitor may be arranged on the insulating layers described above with reference to FIG. 7.

The pixel electrode 221 may be connected to the connection electrode CM via a contact hole of the second organic insulating layer 211, and the connection electrode CM may be connected to the thin-film transistor of the pixel circuit PC via a contact hole of the first organic insulating layer 209. According to some example embodiments, the connection electrode CM may be omitted. The pixel electrode 221 may be connected to the thin-film transistor of the pixel circuit PC via the contact holes of the first organic insulating layer 209 and the second organic insulating layer 211.

The pixel-defining layer 215 on the pixel electrode 221 may include an opening that overlaps the pixel electrode 221, and the opening of the pixel-defining layer 215 may define an emission area EA. The first functional layer 222a, the emission layer 222b, the second functional layer 222C, the opposite electrode 223 and the capping layer 230, which are sequentially stacked, may be arranged on the pixel-defining layer 215. Materials and features of a display layer 200 on the substrate 100 are as described above with reference to FIG. 7.

The first area A1 may be between pixels, for example, between light-emitting diodes including a stack body of the pixel electrode 221, the emission layer 222b, and the opposite electrode 223. The display layer 200 may include a fourth hole 200H in the first area A1.

The fourth hole 200H may be formed when through holes formed in the insulating layers of the display layer 200 overlap one another. The insulating layers of the display layer 200, for example, the buffer layer 201, the gate insulating layer 203, the first interlayer insulating layer 205, the second interlayer insulating layer 207, the first organic insulating layer 209, the second organic insulating layer 211, and the pixel-defining layer 215 may include through holes in the first area A1. A size of the fourth hole 200H may be defined by an insulating layer for defining a hole having a small size of the insulating layers of the display layer 200 described above. According to some example embodiments, FIG. 9 illustrates that the fourth hole 200H is defined by a size of a through hole of the buffer layer 201.

A third portion SL-D of each of the plurality of scan lines SL in the third area A3 may be positioned between the gate insulating layer 203 and the first interlayer insulating layer 205. A third portion DL-D of each of the plurality of data lines DL in the third area A3 may be arranged between the second interlayer insulating layer 207 and the first organic insulating layer 209. According to some example embodiments, the third portion SL-D of each of the plurality of scan lines SL and the third portion DL-D of each of the plurality of data lines DL may be arranged between the first interlayer insulating layer 205 and the second interlayer insulating layer 207.

In the third area A3, the spacer SPC may be arranged above the pixel-defining layer 215. The spacer SPC may maintain a gap between the substrate 100 and the encapsulation substrate 300. The spacer SPC may include a through hole SPCH corresponding to the first area A1 and may be arranged in the form of a closed loop, such as a ring shape or a donut shape, in the third area A3 along a circular arc of the first area A1. At least one of the first functional layer 222a, the second functional layer 222c, the opposite electrode 223, and the capping layer 230, which extend from the second area A2, may be arranged above the spacer SPC. FIG. 9 illustrates an example in which the first functional layer 222a, the second functional layer 222c, the opposite electrode 223 and the capping layer 230, which extend from the second area A2, are arranged above the spacer SPC so as to cover the spacer SPC. Similarly in the insulating layers of the display layer 200, each of the first functional layer 222a, the second functional layer 222c, the opposite electrode 223, and the capping layer 230 may also include a hole formed when a portion of each of the first functional layer 222a, the second functional layer 222c, the opposite electrode 223, and the capping layer 230 that correspond to the first area A1 is removed. According to some example embodiments, as shown in FIG. 10, the first functional layer 222a, the second functional layer 222c, the opposite electrode 223, and the capping layer 230, which are arranged in the second area A2, may not extend into the third area A3 or may be removed from the third area A3 and thus may not be arranged above the spacer SPC.

The encapsulation substrate 300 is arranged to face the substrate 100. In the first area A1, materials included in the display area 200 may not be deposited between a bottom surface of the encapsulation substrate 300 and a top surface of the substrate 100. In other words, the top surface of the substrate 100 in the first area A1 may face directly the bottom surface of the encapsulation substrate 300. The encapsulation substrate 300 may include the same material as the substrate 100 and may have the same refractive index. For example, the substrate 100 and the encapsulation substrate 300 may have a refractive index of about 1.3 to about 1.7, for example, about 1.5. An air gap may be formed in the first area A1 by the substrate 100 and the encapsulation substrate 300.

Figure 10:
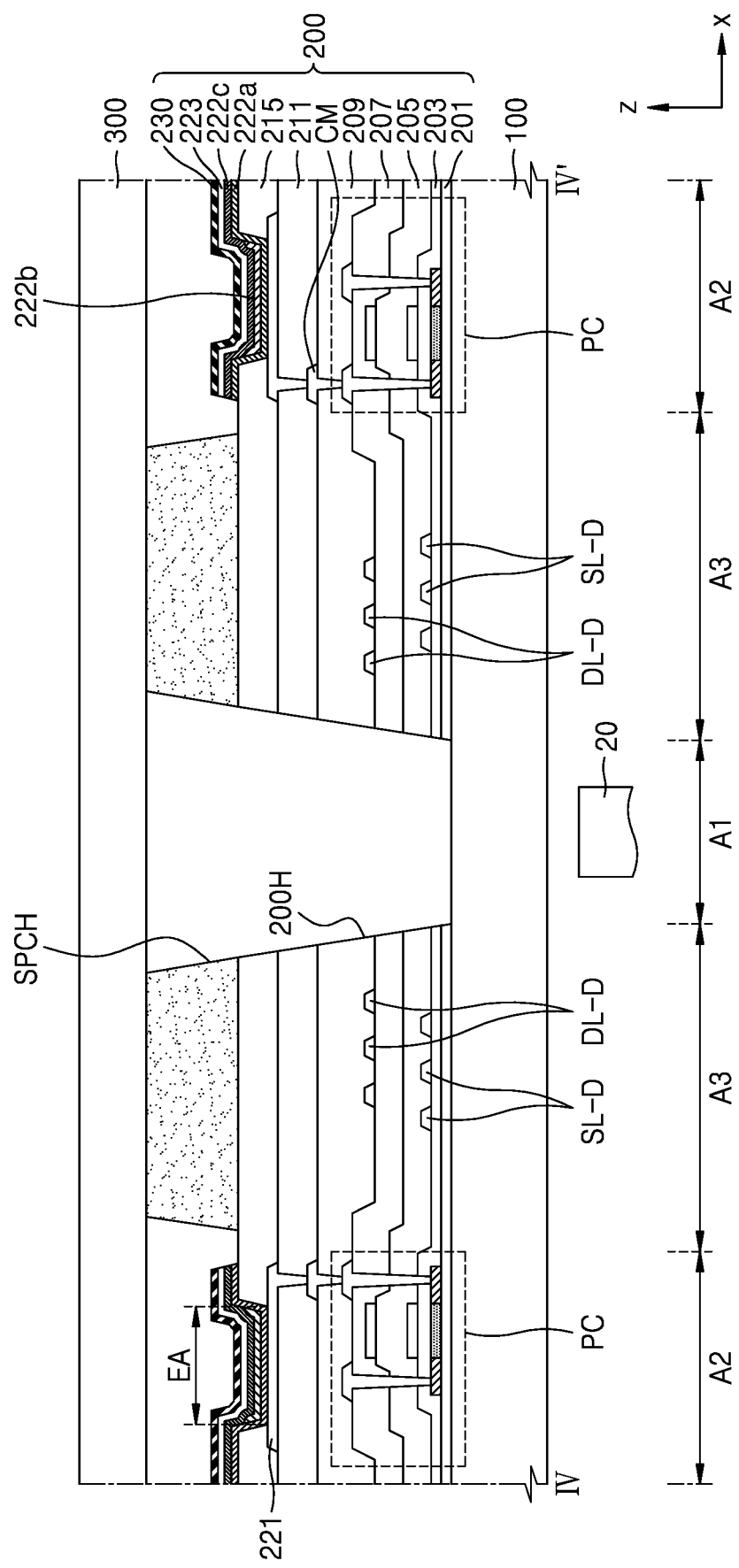
Figure 11:
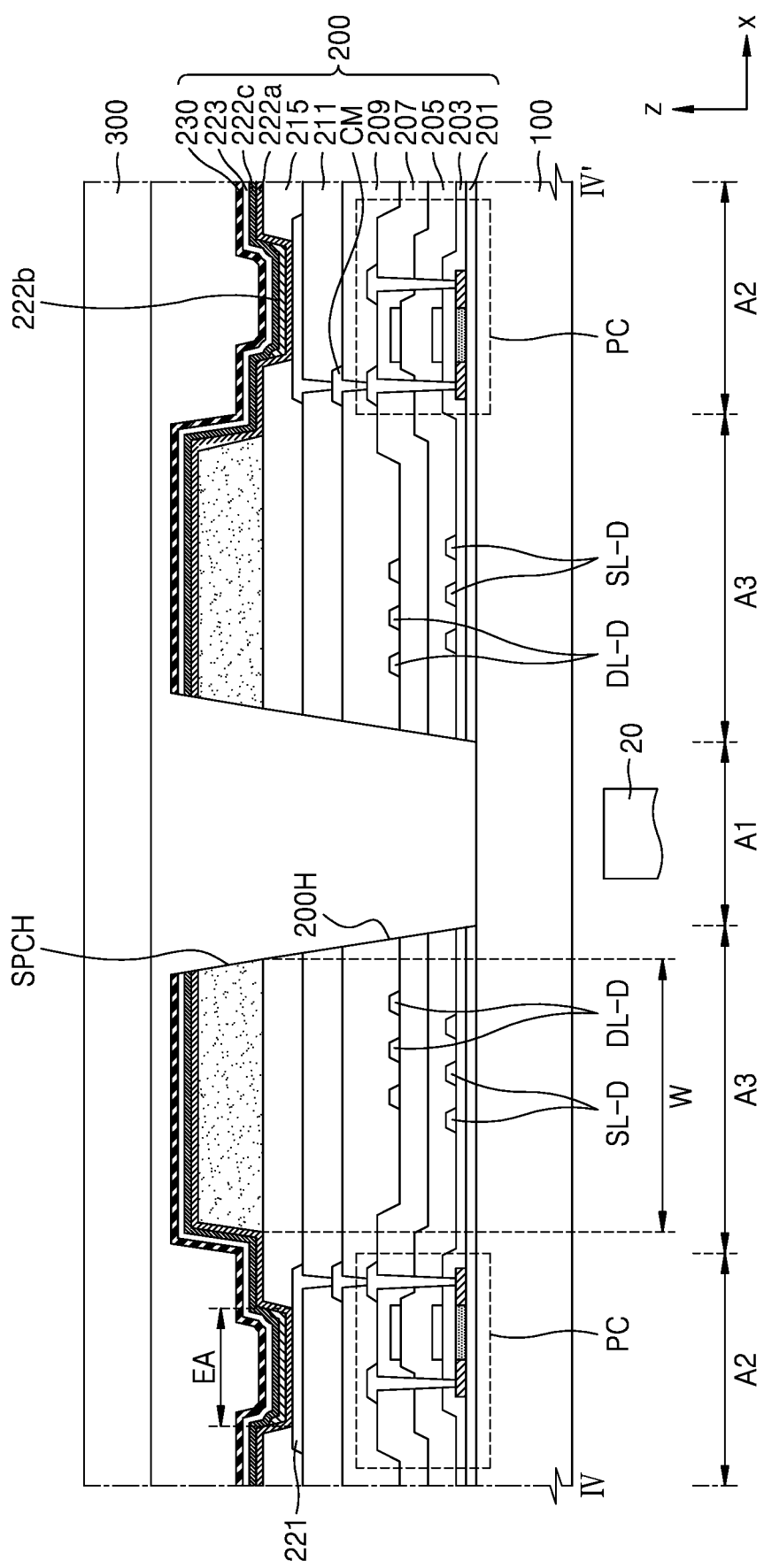

As shown in FIG. 9, the top surface of the capping layer 230 may be in direct contact with the encapsulation substrate 300, or as shown in FIG. 10, the top surface of the spacer SPC may be in direct contact with the encapsulation substrate 300. According to some example embodiments, as shown in FIG. 11, the top surface of the spacer SPC may not be in contact with the encapsulation substrate 300 but may be apart from the encapsulation substrate 300 by a certain distance. When the capping layer 230 is arranged above the spacer SPC, the top surface of the capping layer 230 may not be in contact with the encapsulation substrate 300 but may be apart from the encapsulation substrate 300 by a certain distance.

Figure 12:
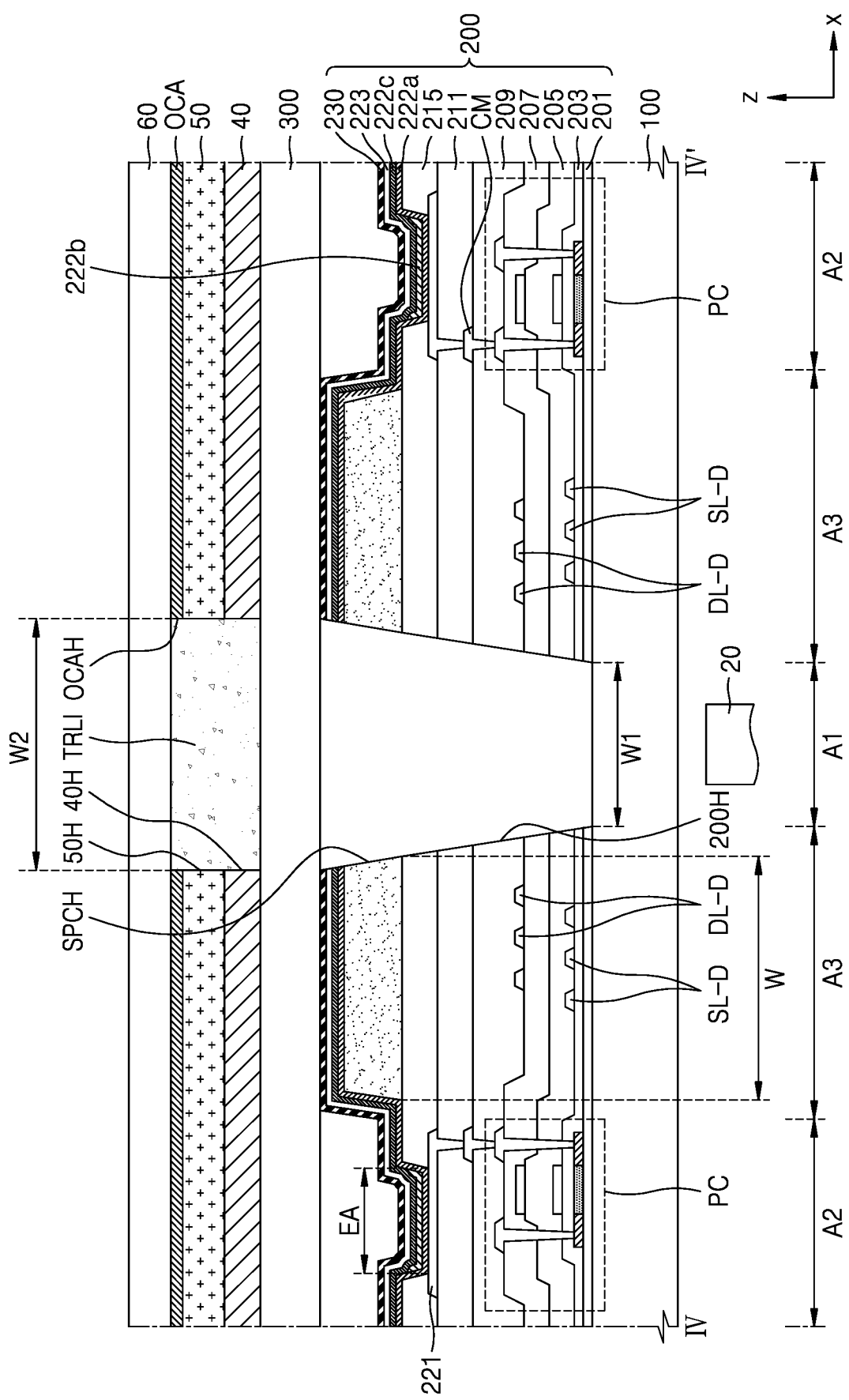

As shown in FIG. 12, the window 60 is arranged above the encapsulation substrate 300, and the input sensing section 40 and the optical functional section 50 may be arranged between the encapsulation substrate 300 and the window 60. An OCA may be arranged between the window 60 and the optical functional section 50. The second hole 50H of the optical functional section 50 may overlap the first hole 40H of the input sensing section 40. The hole OCAH of the OCA may overlap the first hole 40H of the input sensing section 40.

Figure 13:
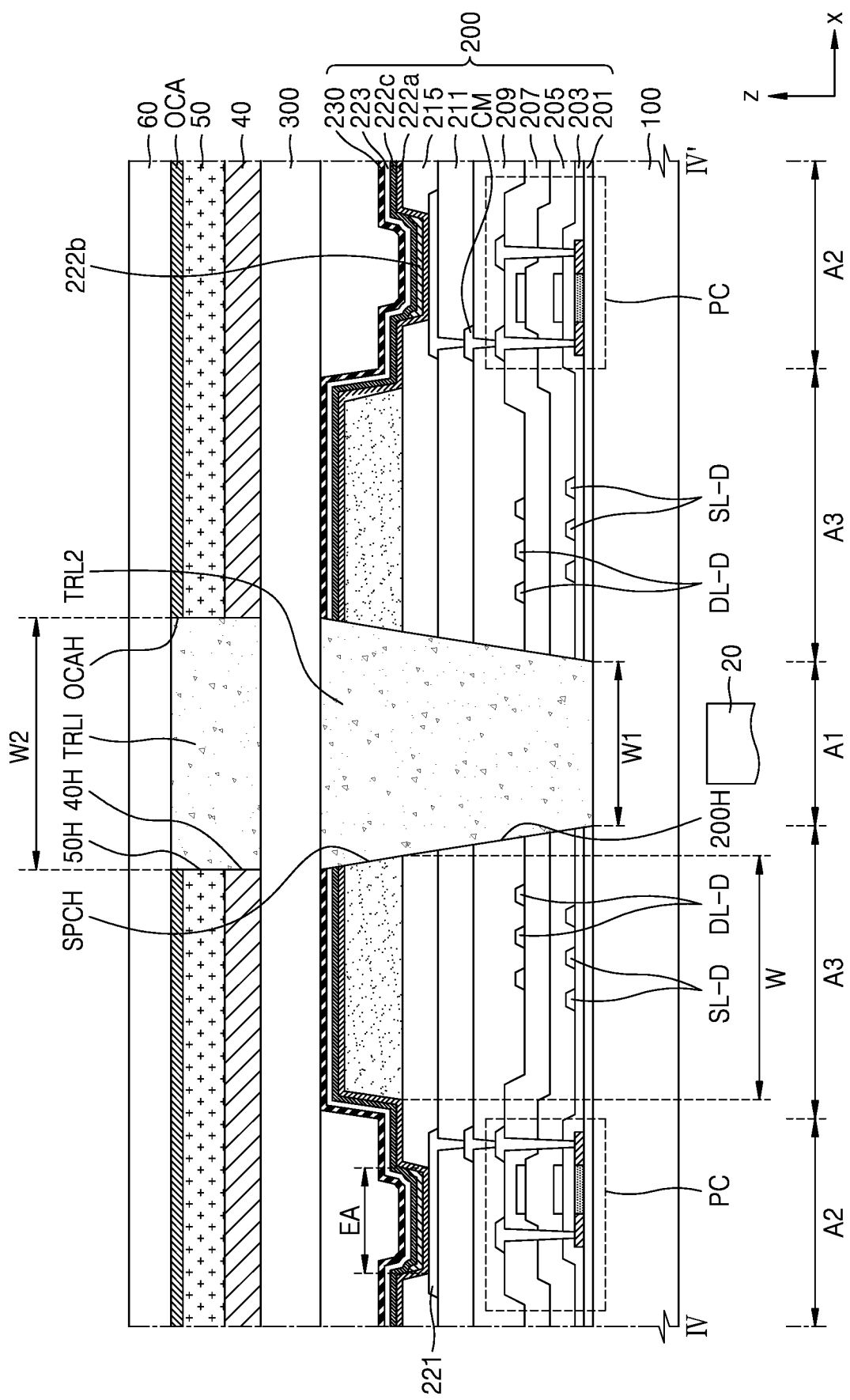

According to some example embodiments, a first transparent layer TRL1 may be arranged in the holes 40H, 50H, and OCAH between the encapsulation substrate 300 and the window 60. According to some example embodiments, as shown in FIG. 13, a second transparent layer TR2 may be arranged in the holes 200H and SPCH between the substrate 100 and the encapsulation substrate 300. The first and second transparent layers TRL1 and TRL2 may include transparent materials having similar refractive indices to those of the substrate 100 and the encapsulation substrate 300. The first and second transparent layers TRL1 and TRL2 may have a refractive index of about 1.3 to about 1.7, for example, of about 1.5. The first and second transparent layers TRL1 and TRL2 may include transparent resin for charging without outgassing. For example, the first and second transparent layers TRL1 and TRL2 may include optical clear resin (OCR). At least one of the first transparent layer TRL1 and the second transparent layer TRL2 may correspond to the first area A1. Thus, transmittance and reflectivity of light that passes through the first area A1 may be improved.

When an air gap is formed in the first area A1 due to the holes 200H and SPCH between the substrate 100 and the encapsulation substrate 300, a portion corresponding to the first area A1 of the encapsulation substrate 300 may sag toward the substrate 100 or may be cut. Thus, a phenomenon that edges of the first area A1 are seen, may occur.

According to some example embodiments of the present disclosure, in the third area A3, the spacer SPC may be arranged between the substrate 100 and the encapsulation substrate 300. Thus, the encapsulation substrate 300 may be supported so that sagging of the encapsulation substrate 300 may be prevented and thus the phenomenon that the edges of the first area A1 described above are seen, may be prevented. Also, according to some example embodiments of the present disclosure, the second transparent layer TR2 may be arranged in the first area A1. Thus, the encapsulation substrate 300 may be supported so that sagging of the encapsulation substrate 300 may be prevented or reduced and thus the phenomenon that the edges of the first area A1 described above are seen, may be more effectively prevented or reduced.

When the second transparent layer TRL2 does not fully fill the first area A1 or extends into the second area A2, the second transparent layer TRL2 may be seen. The spacer SPC in the third area A3 may place the second transparent layer TRL2 properly in the first area A1, thereby fully filling the first area A1 by the second transparent layer TRL2 and preventing the second transparent layer TRL2 from extending into the second area A2. In this case, the top surface of the spacer SPC or a top surface (for example, the capping layer 230) of an uppermost layer above the spacer SPC may be in contact with the encapsulation substrate 300 so that material for forming the second transparent layer TRL2 may be more effectively prevented from penetrating into the second area A2.

Regarding alignment errors during an assembling process of a display apparatus and/or quality of an image captured by a camera according to a viewing angle of the camera as a component 20, a second width W2 of the first hole 40H of the input sensing section 40 and the second hole 50H of the optical functional section 50 may be greater than a first width W1 of the fourth hole 200H of the display layer 200 (W1<W2).

Figure 14:
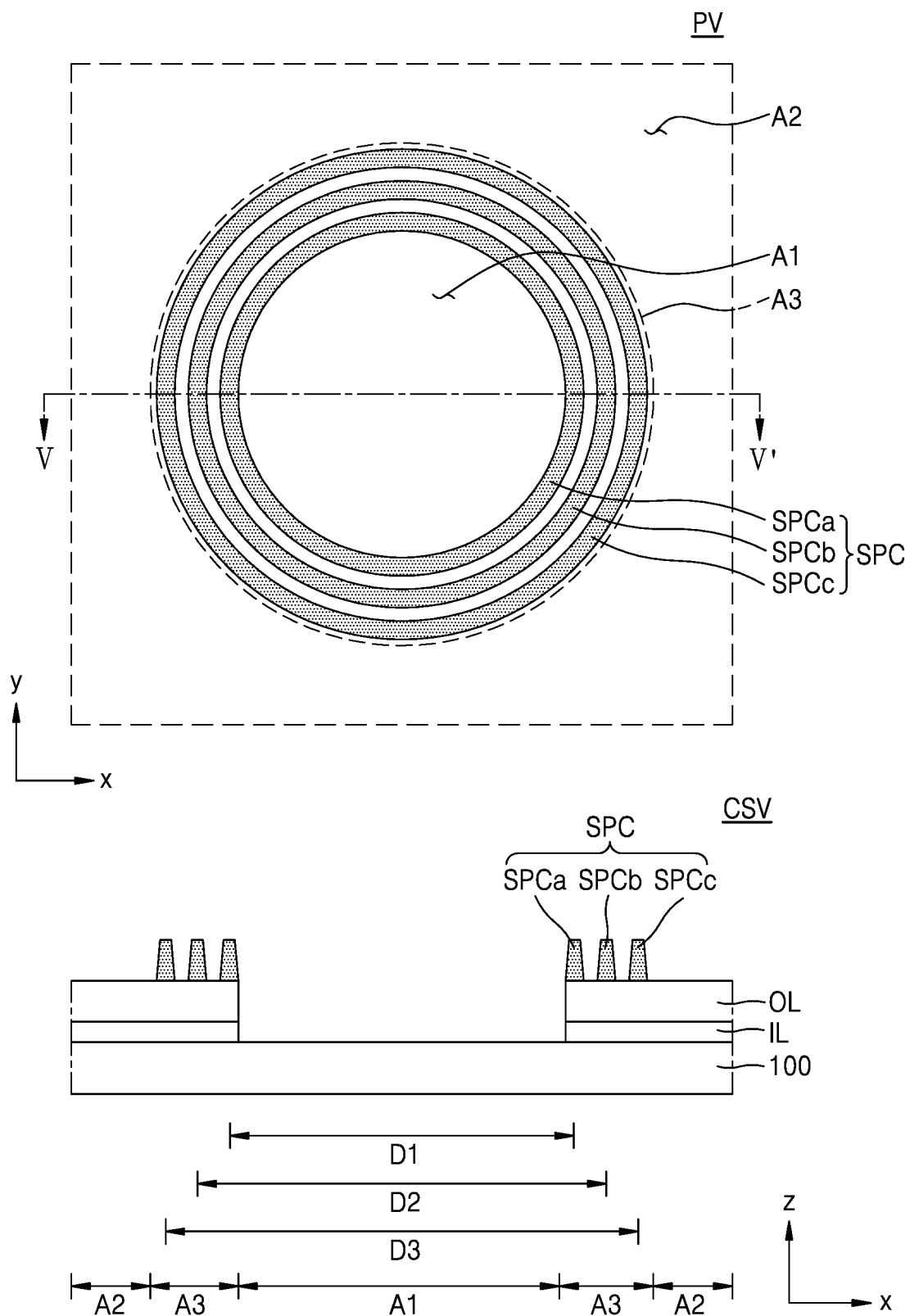
FIG. 14 is a view schematically illustrating part of a display panel according to some example embodiments.

FIG. 14 is a view schematically illustrating part of a display panel according to some example embodiments. FIGS. 15 through 19 may correspond to a cross-section of the display panel taken along a line V-V of the plane view PV of FIG. 14.

FIG. 14 illustrates part of the display panel including the first area A1 and the third area A3 that surrounds the first area A1. The plane view PV of FIG. 14 means a view defined in the xy plane, and the cross-sectional view CSV of FIG. 14 means a view defined in the xz plane. The cross-sectional view CSV of FIG. 14 may correspond to a cross-section of the display panel taken along the line V-V of the plane view PV. The embodiment shown in FIG. 14 is different from the embodiment of FIG. 8 in which a single spacer SPC is arranged, because, in the embodiment of FIG. 14, a plurality of spacers SPC are arranged in the third area A3. A description of the same configuration as that of the embodiment of FIG. 8 will be omitted.

Referring to FIG. 14, a plurality of spacers SPCa, SPCb, and SPCc may be arranged in the third area A3 of the display panel and thus, the spacer SPC having an unevenness structure may be formed. In FIG. 14, three spacers SPCa, SPCb, and SPCc may be arranged in the third area A3. The number of spacers may be two or more according to the size of the third area A3. The spacers SPCa, SPCb, and SPCc may surround the first area A1 fully, may be apart from one another by a certain distance, and each of the spacers SPCa, SPCb, and SPCc may have a ring or donut shape. As getting farther away from the first area A1, a diameter of the spacer may be increased (D1<D2<D3). The spacer SPCa that is most adjacent to the first area A1 among the spacers SPCa, SPCb, and SPCc may include a through hole SPCH' (see FIG. 15) corresponding to the first area A1 and may be arranged in the form of a ring or donut in the third area A3 along the circular arc of the first area A1. The spacer SPCb may be apart from the spacer SPCa and may surround the spacer SPCa. The spacer SPCc may be apart from the spacer SPCb and may surround the spacer SPCb. The spacers SPCa, SPCb, and SPCc may be arranged on at least one inorganic insulating layer IL and at least one organic insulating layer OL above the substrate 100. A width of each of the plurality of spacers SPCa, SPCb, and SPCc may be less than the width W of the single spacer SPC shown in FIG. 8. Widths of the spacers SPCa, SPCb, and SPCc may be the same or different from one another.

Figure 15:
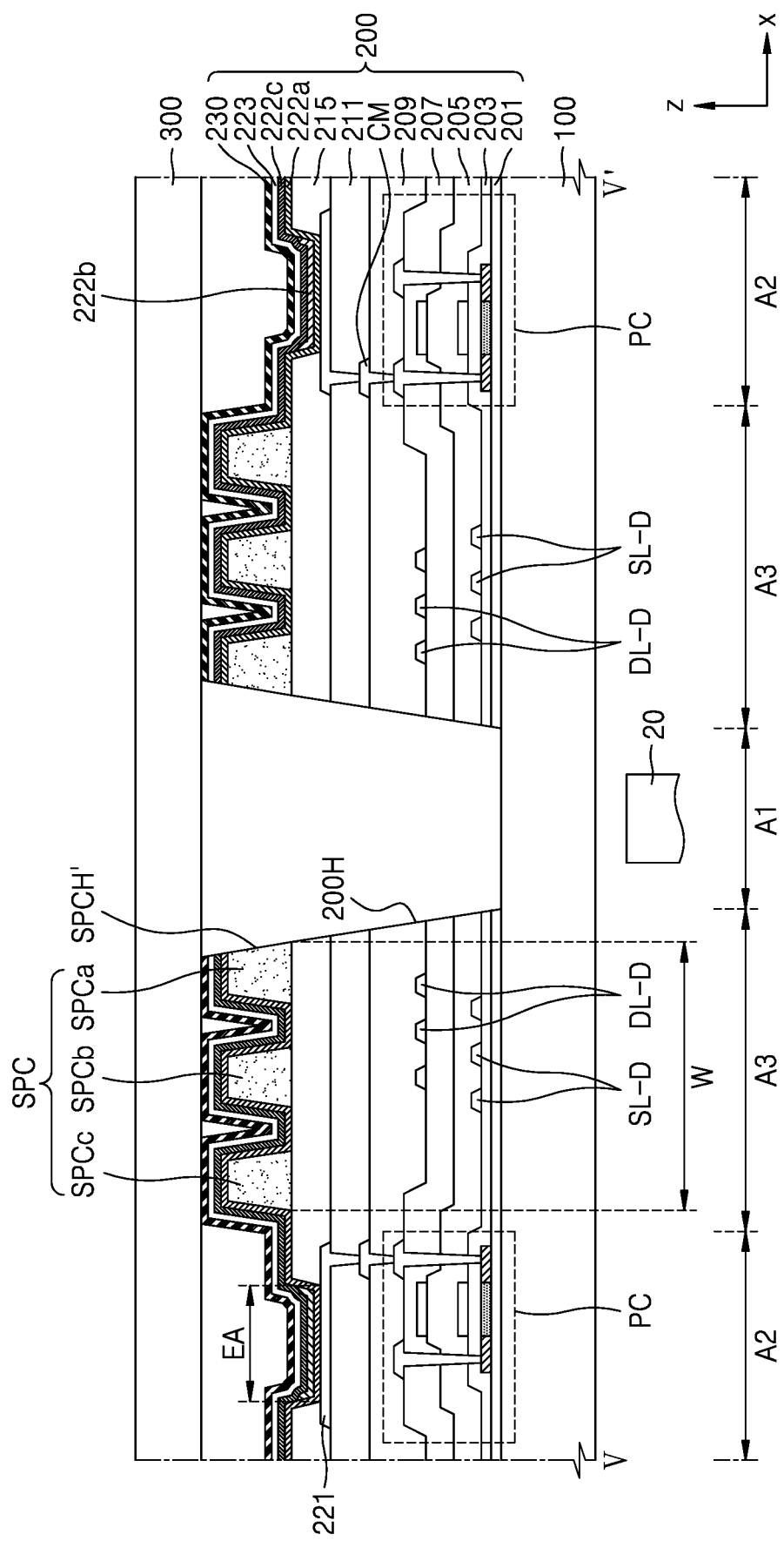
FIGS. 15 through 19 are cross-sectional views of the display panel taken along the line V-V of FIG. 14.

Referring to FIG. 15, the plurality of spacers SPCa, SPCb, and SPCc may be arranged above the pixel-defining layer 215 in the third area A3. The spacers SPCa, SPCb, and SPCc may maintain a gap between the substrate 100 and the encapsulation substrate 300. At least one of the first functional layer 222a, the second functional layer 222c, the opposite electrode 223, and the capping layer 230, which extend from the second area A2 to the third area A3, may be arranged above at least one of the spacers SPCa, SPCb, and SPCc. FIG. 15 illustrates an example in which the first functional layer 222a, the second functional layer 222c, the opposite electrode 223 and the capping layer 230, which extend from the second area A2 to the third area A3, are arranged above the spacers SPCa, SPCb, and SPCc and at a gap therebetween so as to cover the spacers SPCa, SPCb, and SPCc and the gap therebetween. According to some example embodiments, at least one of the first functional layer 222a, the second functional layer 222c, the opposite electrode 223, and the capping layer 230, which extend from the second area A2 to the third area A3, may be arranged only above the spacer SPCc adjacent to the second area A2. According to some example embodiments, as shown in FIG. 16, the first functional layer 222a, the second functional layer 222c, the opposite electrode 223, and the capping layer 230, which are arranged in the second area A2, may not extend into the third area A3 or may be removed from the third area A3 and thus may not be arranged above the spacers SPCa, SPCb, and SPCc.

Figure 17:
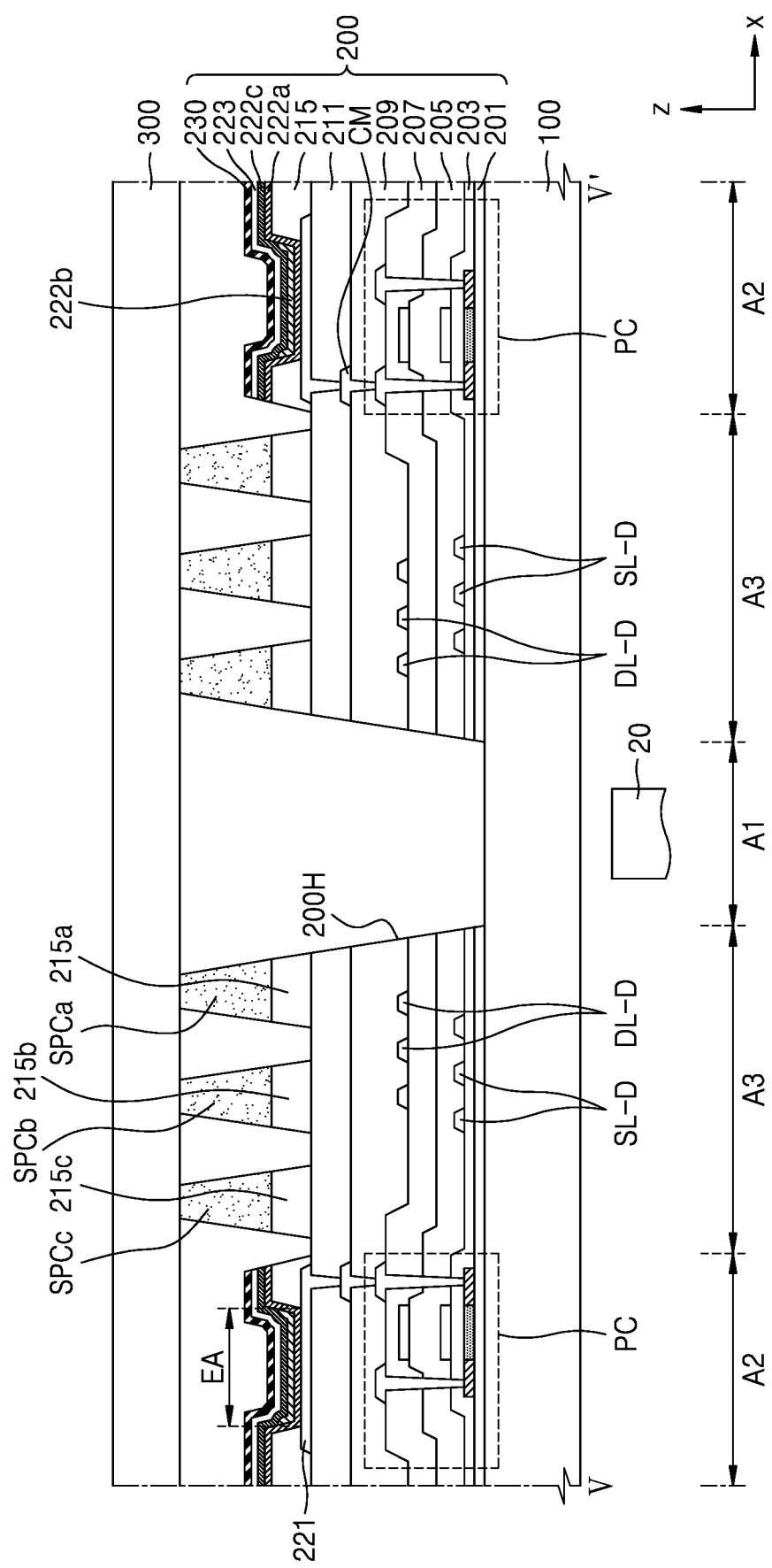

According to some example embodiments, the spacer SPC may have a multi-layer structure. For example, as shown in FIG. 17, the pixel-defining layer 215 in the third area A3 may constitute a part of the spacer SPC. That is, each of the spacers SPCa, SPCb, and SPCc may constitute an upper layer of the spacer SPC, and each of pixel-defining layer patterns 215a, 215b, and 215c arranged below each of the spacers SPCa, SPCb, and SPCc may constitute a lower layer of the spacer SPC. A top surface of the second organic insulating layer 211 may be exposed at a gap between the spacers SPCa, SPCb, and SPCc and the pixel-defining layer patterns 215a, 215b, and 215c. By patterning a pixel-defining layer-forming layer and a spacer-forming layer simultaneously, the pixel-defining layer patterns 215a, 215b, and 215c and the spacers SPCa, SPCb, and SPCc may be simultaneously formed. In this case, a side surface of each of the spacers SPCa, SPCb, and SPCc and a side surface of each of the pixel-defining layer patterns 215a, 215b, and 215c may coincide with each other. In the embodiment of FIG. 17, as shown in FIG. 15, the first functional layer 222a, the second functional layer 222c, the opposite electrode 223, and the capping layer 230, which extend from the second area A2 to the third area A3, may be arranged above the spacers SPCa, SPCb, and SPCc and at a gap therebetween so as to cover the spacers SPCa, SPCb, and SPCc and the gap therebetween.

Figure 16:
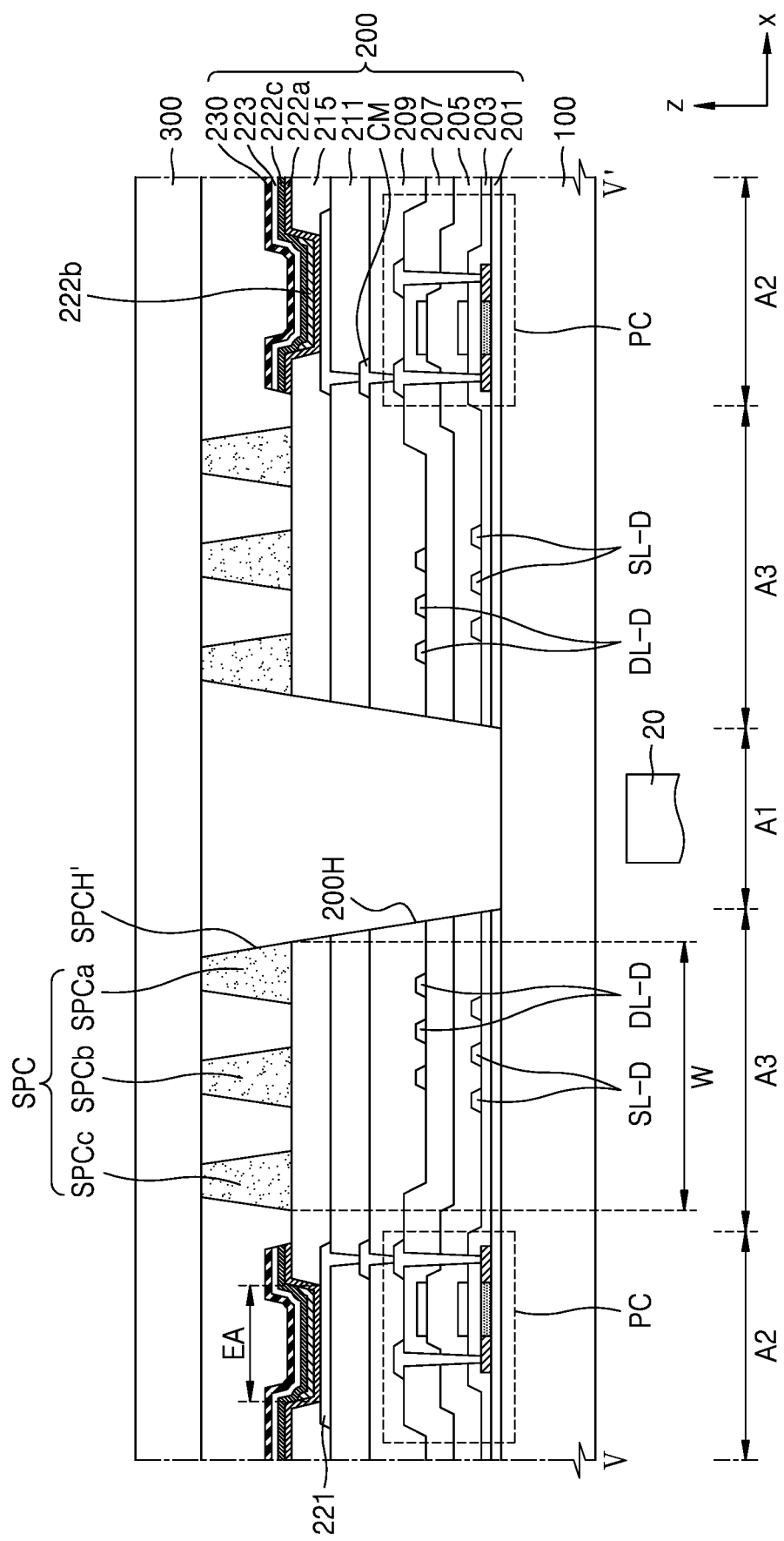

As shown in FIG. 15, the top surface of the capping layer 230 may be in direct contact with the encapsulation substrate 300, or as shown in FIGS. 16 and 17, top surfaces of the spacers SPC may be in direct contact with the encapsulation substrate 300. According to some example embodiments, the top surfaces of the spacers SPC may not be in contact with the encapsulation substrate 300 but may be apart from the encapsulation substrate 300 by a certain distance. When the capping layer 230 is arranged above the spacers SPC, the top surface of the capping layer 230 may not be in contact with the encapsulation substrate 300 but may be apart from the encapsulation substrate 300 by a certain distance.

Figure 18:
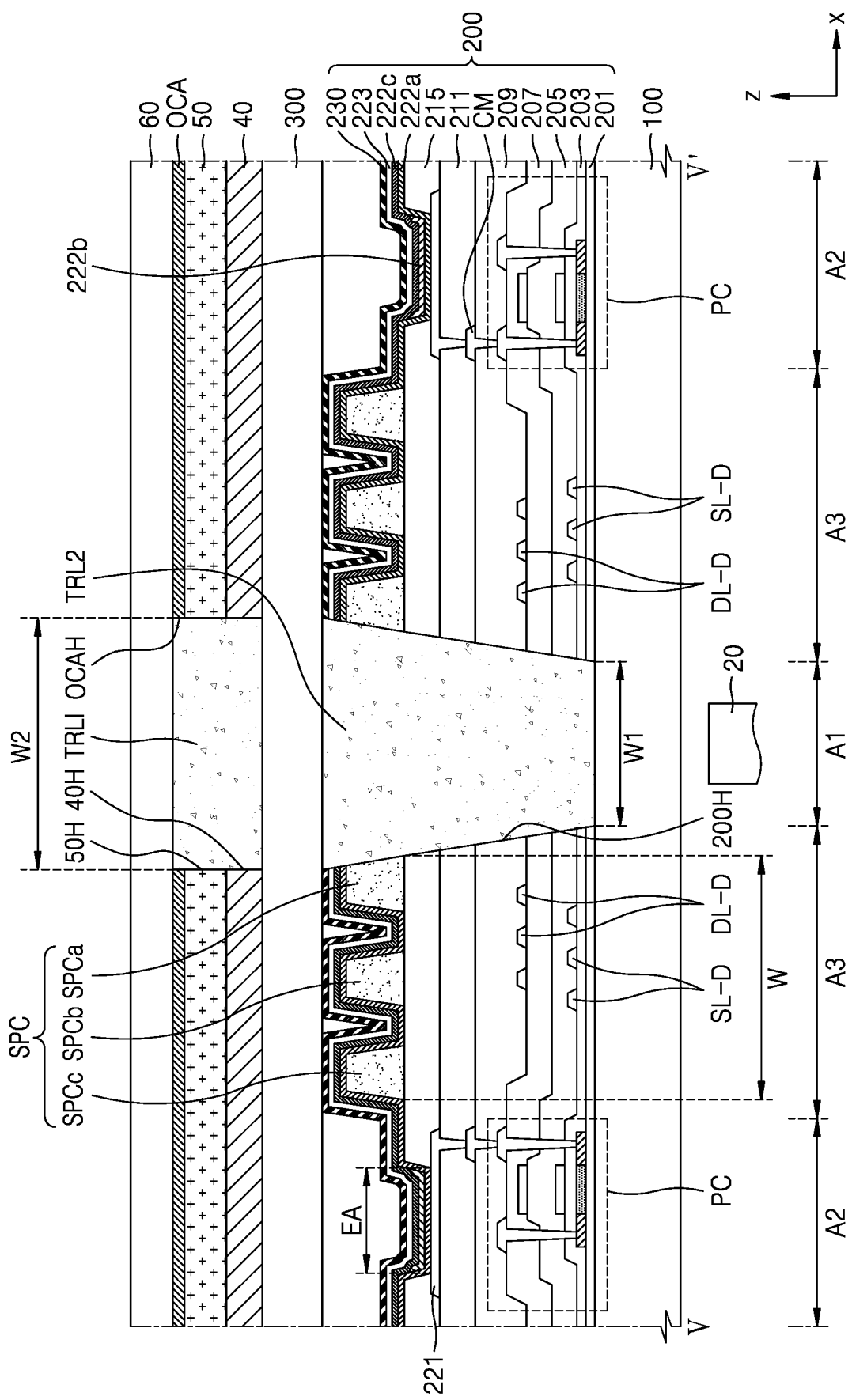
Figure 19:
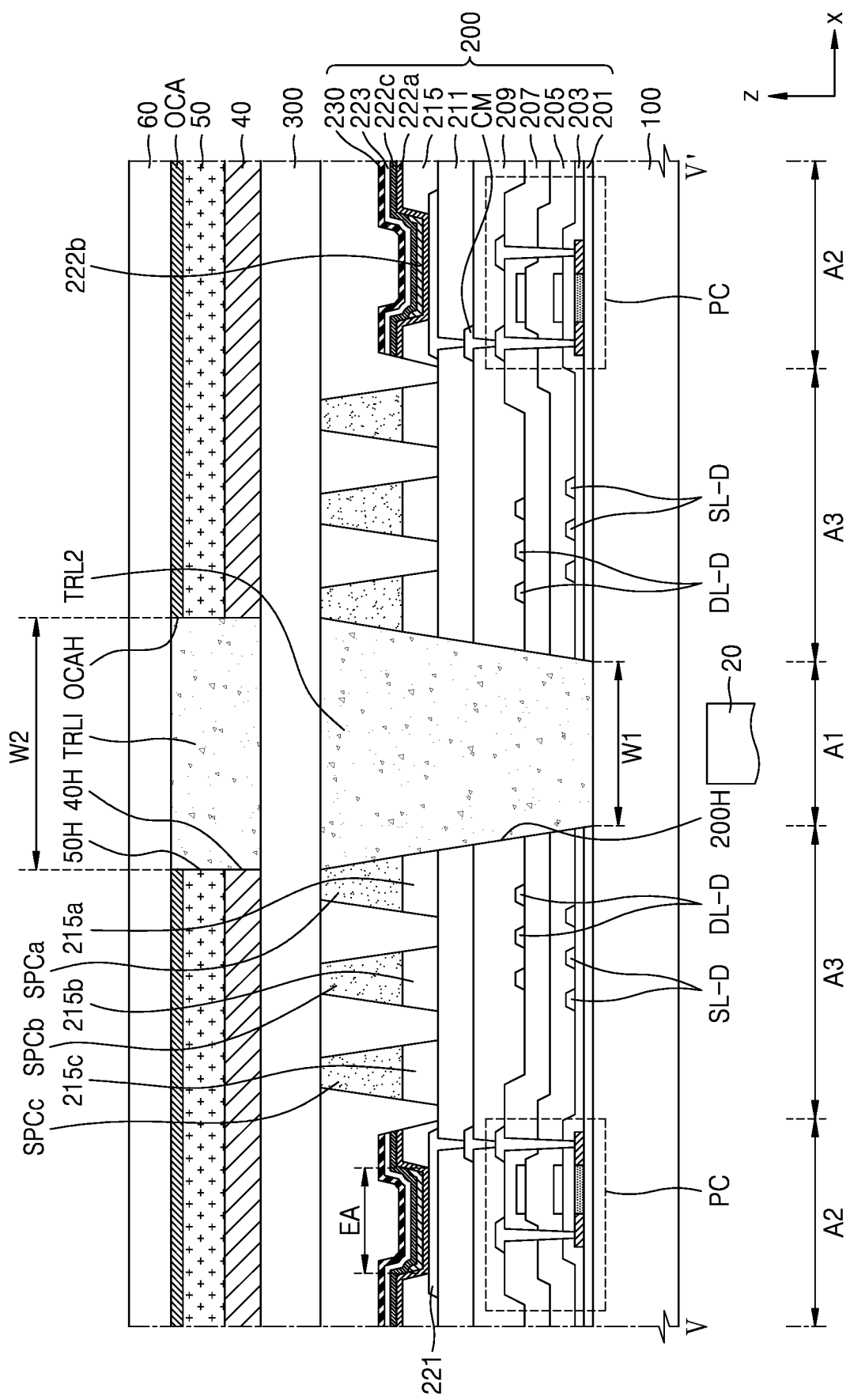

The window 60 may be arranged above the encapsulation substrate 300 shown in FIGS. 15 through 17, and the input sensing section 40 and the optical functional section 50 may be arranged between the encapsulation substrate 300 and the window. FIGS. 18 and 19 illustrate the input sensing section 40, the optical functional section 50, and the window 60 above the display panel 10 of FIGS. 15 and 17. According to some example embodiments, the input sensing section 40, the optical functional section 50, and the window 60 may also be arranged above the display panel 10 of FIG. 16. An OCA may be arranged between the window 60 and the optical functional layer 50. The second hole 50H of the optical functional section 50 may overlap the first hole 40H of the input sensing section 40. The hole OCAH of the OCA may overlap the first hole 40H of the input sensing section 40.

The first transparent layer TRL1 may be arranged in the holes 40H, 50H, and OCAH between the encapsulation substrate 300 and the window 60. The second transparent layer TRL2 may be further arranged in the holes 200H and SPCH between the substrate 100 and the encapsulation substrate 300. Due to the spacer SPC having the unevenness structure, a path on which the second transparent layer TRL2 penetrates into the second area A2, may be increased and thus, the second transparent layer TRL2 may be prevented from extending into the second area A2.

Figure 20:
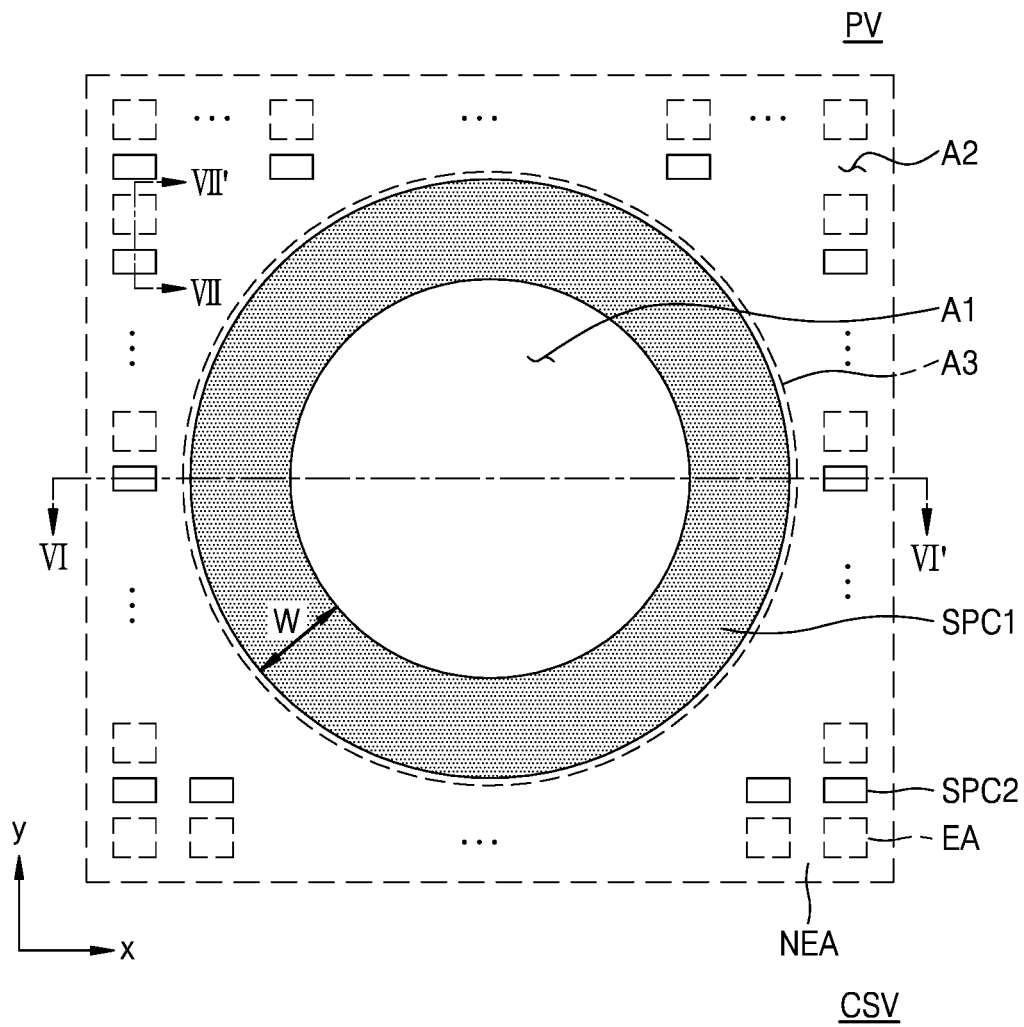
FIG. 20 is a view schematically illustrating part of a display panel according to some example embodiments.
Figure 20:
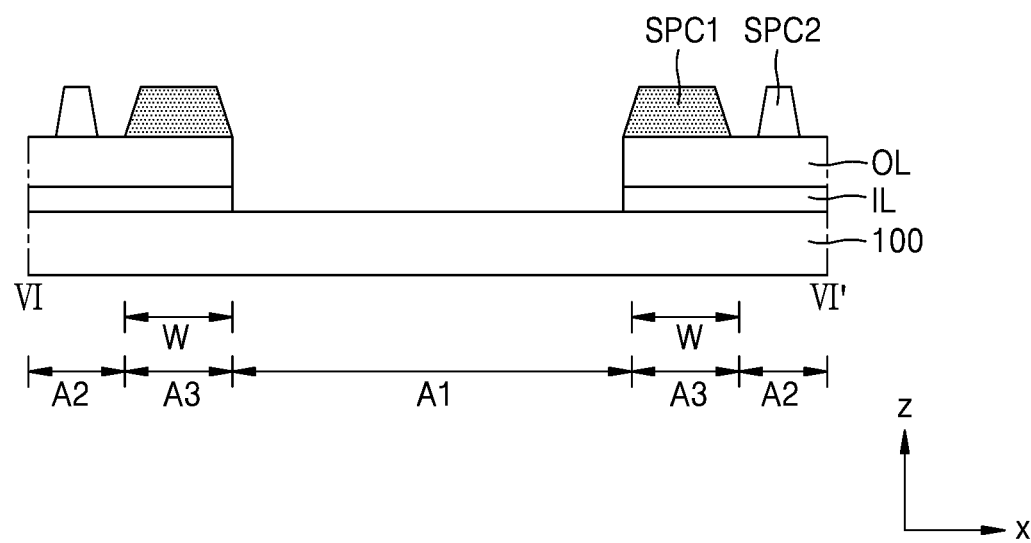

FIG. 20 is a view schematically illustrating part of a display panel according to some example embodiments. A cross-sectional view CSV of FIG. 20 may correspond to a cross-section of the display panel taken along a line VI-VI' of the plane view PV, and FIG. 21 may correspond to a cross-section of the display panel taken along a line VII-VII' of the plane view PV of FIG. 20.

The embodiment of FIG. 20 is an example in which a spacer is further arranged in the second area A2 in the embodiment of FIG. 8. Hereinafter, a description of the same configuration as that of FIG. 8 will be omitted.

Figure 21:
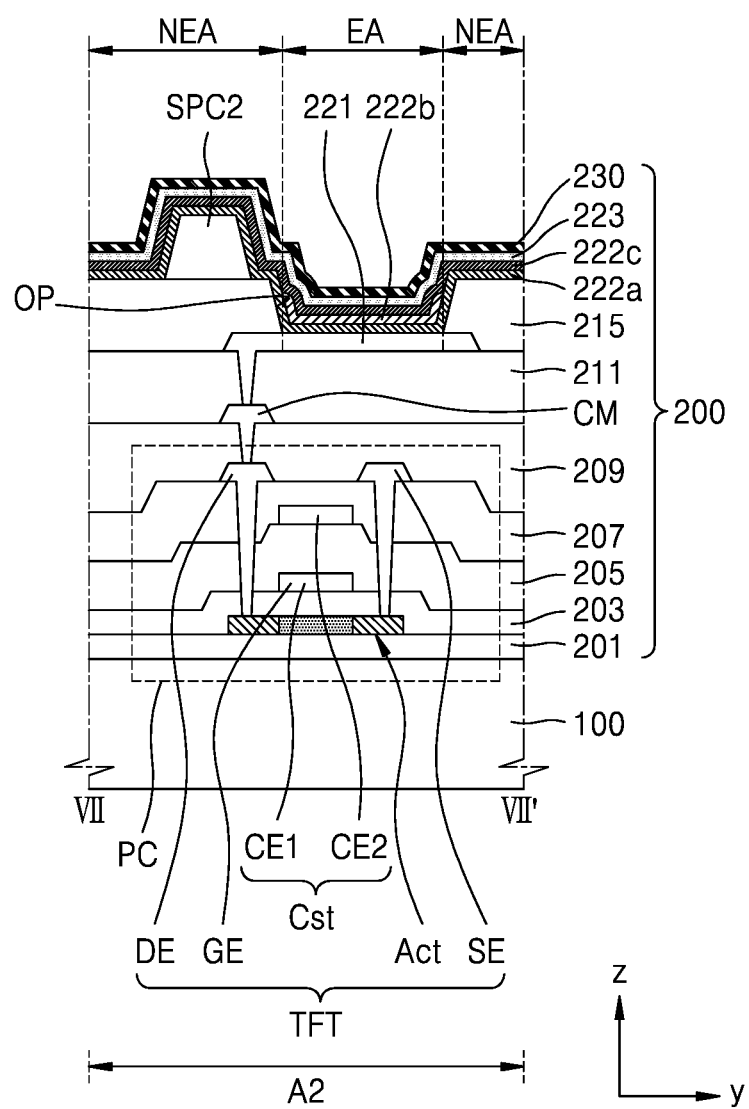
FIG. 21 is a cross-sectional view of the display panel taken along the line VII-VII' of FIG. 20.

Referring to FIG. 20, the third area A3 may be between the first area A1 and the second area A2. The second area A2 may include a plurality of emission areas EA and a non-emission area NEA that surrounds the plurality of emission areas EA. As shown in FIG. 21, the emission area EA may be defined by the opening of the pixel-defining layer 215.

A first spacer SPC1 may be arranged in the third area A3, and a plurality of second spacers SPC2 may be arranged in the second area A2. The first spacer SPC1 may surround the first area A1 fully and may have a ring shape or donut shape. According to some example embodiments, as shown in FIG. 14, the plurality of first spacers SPC1 having the ring shape or donut shape may surround the first area A1 fully. The second spacers SPC2 may be arranged in the non-emission area NEA between the adjacent emission areas EA by a certain distance. The emission areas EA may emit red, green, blue, or white light, for example. The emission areas EA may have various arrangements, such as stripe arrangement, pentile arrangement, and mosaic arrangement, etc.

Referring to FIG. 21, the spacer SPC2 may be formed on the pixel-defining layer 215 of the second area A2. The second spacer SPC2 may include an organic insulating material, such as polyimide. Alternatively, the second spacer SPC2 may include an inorganic insulating material, such as silicon nitride or silicon oxide, or an organic insulating material and an inorganic insulating material. The second spacer SPC2 may include a different material from that of the pixel-defining layer 215. Alternatively, the second spacer SPC2 may include the same material as that of the pixel-defining layer 215. In this case, the pixel-defining layer 215 and the second spacer SPC2 may be formed together in a mask process using a halftone mask. According to some example embodiments, the pixel-defining layer 215 and the second spacer SPC2 may include polyimide. The first spacer SPC1 may include a different material from that of the second spacer SPC2. Alternatively, the first spacer SPC1 may include the same material as that of the second spacer SPC2. In this case, the first spacer SPC1 and the second spacer SPC2 may be simultaneously formed in the same process.

The first spacer SPC1 and the second spacer SPC2 may have the same height and may maintain a gap between the substrate 100 and the encapsulation substrate 300 in the second area A2 and the third area A3.

According to one or more embodiments of the present disclosure, a transmission area of a display apparatus having the transmission area in a display area may not be seen and damage to the display apparatus may be prevented or reduced. These effects are just an example, and the scope of embodiments according to the present disclosure are not limited thereby.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
a first substrate including a transmission area, a display area that surrounds at least part of the transmission area, and a first non-display area between the transmission area and the display area;
an insulating layer in the display area and the first non-display area;
a plurality of display elements in the display area;
a spacer above the insulating layer in the first non-display area and surrounding the transmission area; and
a second substrate facing the first substrate with the spacer maintaining a gap between the second substrate and the first substrate at the transmission area and the display area.

2. The display apparatus of claim 1, wherein the insulating layer comprises at least one inorganic insulating layer and at least one organic insulating layer.

3. The display apparatus of claim 2, wherein each of the plurality of display elements comprises a first electrode, a second electrode facing the first electrode, and an emission layer between the first electrode and the second electrode, and
the organic insulating layer comprises a pixel-defining layer between the first electrodes of the display elements.

4. The display apparatus of claim 3, wherein the spacer is above the pixel-defining layer in the first non-display area.

5. The display apparatus of claim 3, wherein the second electrode covers the pixel-defining layer and the spacer.

6. The display apparatus of claim 1, wherein the spacer comprises a plurality of ring-shaped second spacers that surround the transmission area and are apart from one another.

7. The display apparatus of claim 6, wherein each of the second spacers comprises a lower layer and an upper layer, and
the lower layer is part of an insulating layer in the first non-display area.

8. The display apparatus of claim 1, further comprising a sealant bonding together the first substrate and the second substrate and arranged in a second non-display area surrounding the display area.

9. The display apparatus of claim 1, further comprising a signal line bent along edges of the transmission area and arranged in the first non-display area.

10. The display apparatus of claim 9, wherein the spacer overlaps the signal line.

11. The display apparatus of claim 1, wherein the spacer comprises an organic insulating material.

12. The display apparatus of claim 1, further comprising a transparent layer in the transmission area.

13. A display apparatus comprising:
a first substrate including a transmission area and a display area that surrounds at least part of the transmission area;
an insulating layer on the first substrate and having a through hole corresponding to the transmission area;
a spacer above the insulating layer and surrounding the through hole along an edge of the through hole; and
a second substrate facing the first substrate with the spacer maintaining a gap between the second substrate and the first substrate at the transmission area and the display area.

14. The display apparatus of claim 13, wherein the insulating layer comprises at least one inorganic insulating layer and at least one organic insulating layer, and
the spacer is above the at least one organic insulating layer.

15. The display apparatus of claim 13, wherein the spacer comprises an organic insulating material.

16. The display apparatus of claim 13, wherein the spacer comprises a plurality of second spacers surrounding the through hole and spaced apart from one another.

17. The display apparatus of claim 16, wherein each of the second spacers comprises a lower layer and an upper layer, and
the lower layer is part of the insulating layer.

18. The display apparatus of claim 13, further comprising a transparent layer in the through hole of the insulating layer.

19. The display apparatus of claim 13, further comprising a plurality of display elements adjacent the through hole,
wherein the spacer is between the plurality of display elements and the through hole and has a ring shape, and surrounds the through hole.

20. The display apparatus of claim 19, wherein each of the display elements comprises a first electrode, a second electrode facing the first electrode, and an emission layer between the first electrode and the second electrode, and
the insulating layer comprises a pixel-defining layer between the first electrodes of the display elements, and
the spacer is arranged on the pixel-defining layer adjacent the through hole.

* * * * *